US009177666B2

(12) United States Patent
Wu

(10) Patent No.: US 9,177,666 B2
(45) Date of Patent: Nov. 3, 2015

(54) SHIFT REGISTER UNIT AND DRIVING METHOD THEREOF, SHIFT REGISTER AND DISPLAY APPARATUS

(71) Applicant: BOE TECHNOLOGY GROUP CO., LTD., Beijing (CN)

(72) Inventor: Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/995,313

(22) PCT Filed: Dec. 21, 2012

(86) PCT No.: PCT/CN2012/087211
§ 371 (c)(1),
(2) Date: Jun. 18, 2013

(87) PCT Pub. No.: WO2013/152604
PCT Pub. Date: Oct. 17, 2013

(65) Prior Publication Data
US 2014/0093028 A1 Apr. 3, 2014

(30) Foreign Application Priority Data

Apr. 13, 2012 (CN) .......................... 2012 1 0109688
Jul. 30, 2012 (CN) .......................... 2012 1 0269029

(51) Int. Cl.
*G11C 19/00* (2006.01)
*G11C 19/28* (2006.01)
(52) U.S. Cl.
CPC ........ *G11C 19/28* (2013.01); *G09G 2300/0408* (2013.01); *G09G 2310/0286* (2013.01); *G09G 2330/021* (2013.01)
(58) Field of Classification Search
None
See application file for complete search history.

(56) References Cited

U.S. PATENT DOCUMENTS 7,612,754 B2 * 11/2009 Kuo et al. ...................... 345/100
8,098,227 B2 * 1/2012 Lee et al. ...................... 345/100
(Continued)

FOREIGN PATENT DOCUMENTS

CN   101093647 A   12/2007
CN   101650506 A   2/2010
(Continued)

OTHER PUBLICATIONS

International Search Report mailed Mar. 28, 2013; PCT/CN2012/087211.
(Continued)

*Primary Examiner* — Tuan T Lam
(74) *Attorney, Agent, or Firm* — Ladas & Parry LLP

(57) ABSTRACT

The present disclosure relates to a shift register unit and a driving method thereof, a shift register and a display apparatus. The shift register unit includes a carry signal output terminal (CA(n)); a driving signal output terminal (OUT(n)); a staged output module (33) connected to the pulling-up node (PU), the pulling-down node (PD), the carry signal output terminal (CA(n)) and the driving signal output terminal (OUT (n)), respectively, for outputting a carry signal and a driving signal in stages so that the driving signal maintains a high level in the evaluating phase and a low level in the resetting phase; a pulling-up node level maintaining module (34) for, in the evaluating phase, maintaining the level at the pulling-up node (PU) at a high level via the first output control module (31) so that the driving signal maintains the high level. It removes the effect of the leakage current of the depletion type TFT on the shift register by using staged output and maintaining the pulling-up node level, which increases stability and reliability thereof and decreases power consumption.

15 Claims, 13 Drawing Sheets

(56) References Cited

U.S. PATENT DOCUMENTS

| | | | |
|---|---|---|---|
| 8,107,586 B2* | 1/2012 | Shin et al. | 377/64 |
| 8,174,478 B2* | 5/2012 | Kim et al. | 345/100 |
| 2007/0127620 A1* | 6/2007 | Moon et al. | 377/64 |
| 2008/0048712 A1* | 2/2008 | Ahn et al. | 326/21 |
| 2010/0039363 A1 | 2/2010 | Lee et al. | |
| 2010/0086097 A1* | 4/2010 | Tseng et al. | 377/79 |
| 2011/0157124 A1 | 6/2011 | Jung et al. | |
| 2013/0108006 A1* | 5/2013 | Tobita | 377/64 |
| 2014/0064439 A1 | 3/2014 | Qing et al. | |
| 2014/0093027 A1* | 4/2014 | Jang | 377/64 |
| 2014/0093028 A1 | 4/2014 | Wu | |

FOREIGN PATENT DOCUMENTS

| | | |
|---|---|---|
| CN | 102117659 A | 7/2011 |
| CN | 102779478 A | 11/2012 |
| CN | 10281998 A | 12/2012 |
| CN | 202736497 A | 2/2013 |
| CN | 202677790 U | 6/2013 |
| KR | 20090050358 A | 5/2009 |

OTHER PUBLICATIONS

First Chinese Office Action dated Nov. 7, 2013; Appln. No. 201210269029.0.

International Preliminary Report on Patentability dated Oct. 14, 2014; PCT/CN2012/087211.

Korean Office Action dated Jun. 24, 2014; Appln. No. 10-2013-7018154.

Korean Office Action dated Dec. 26, 2014; Appln. No. 10-2013-7018154.

Third Chinese Office Action dated Dec. 3, 2014; Appln. No. 201210269029.0.

* cited by examiner

SHIFT REGISTER UNIT AND DRIVING METHOD THEREOF, SHIFT REGISTER AND DISPLAY APPARATUS

TECHNICAL FIELD OF THE DISCLOSURE

The present disclosure relates to the field of organic light-emitting display, and particularly to a shift register unit and a driving method thereof, a shift register and a display apparatus.

BACKGROUND

In Active Matrix Display, scan lines of respective rows and data lines of respective columns intersect to constitute an active matrix. A progressive scanning method is usually adopted to turn on transistors of respective rows sequentially and write voltage on data lines into pixels. A row scanning and driving circuit integrated on a display back board has the advantages of narrow edge and low cost, and has been used in most of LCD/AMOLED display devices.

There are many kinds of processes for manufacturing a back board of display devices at present, for example, a-Si, LTPS, Oxide Thin Film Transistor(TFT), and etc. The a-Si process is relative mature and has low cost, but a-Si TFT has the disadvantages of low mobility and low stability. LTPS TFT has the advantages of rapid speed and great stability and the disadvantages of low uniformity and high cost, and is not suitable to the preparation of a panel with large size. Oxide TFT has the advantages of high mobility, good uniformity and low cost, and is a kind of technology of best suitable to a large size panel in future. However, the I-V transfer characteristics of the Oxide TFT is usually in a depletion mode, that is, the Oxide TFT is still turned on when a gate-source voltage Vgs of the Oxide TFT is zero.

A depletion type TFT brings challenge on the integration of a shift register on a display back board. FIG. 1A is a structure diagram of a conventional shift register, and all of transistors in FIG. 1A are N-type TFTs. As shown in FIG. 1A, the conventional shift register includes a first output transistor T1, a second output transistor T2, a first control module 11 for controlling T1 and a second control module 12 for controlling T2. An output terminal of a shift register at each stage is connected to an input terminal of a shift register at a next stage, and shift registers at respective stages are controlled alternately by two clock signals CLK1 and CLK2 having a duty ratio of 50%. All of input signals and control signals have a swing of VGL~VGH, wherein VGL is a low level and VGH is a high level. The first output transistor T1 is connected to the clock signal CLK2 and the output terminal OUT(n) and functions as transferring the high level, and the second output transistor T2 is connected to a low level output terminal for outputting the low level VGL and the output terminal OUT(n) and functions as transferring the low level.

As shown in FIG. 1B, operations of the shift register can be divided into three phases:

A first phase is a pre-charging phase, when an output terminal OUT(n−1) of a shift register at a previous stage generates a high level pulse, a PU node (a node connected to a gate of T1, that is, a pulling-up node) is controlled to be charged to the high level VGH, and meanwhile a PD node (a node connected to a gate of T2, that is, a pulling-down node) is controlled to be discharged to the low level VGL, so that T1 is turned on to transfer the low level of CLK2 to the output terminal OUT(n) and T2 is turned off;

A second phase is an evaluating phase, in a next half clock cycle, the PU node becomes a floating state, that is, no signal is input to the PU node since transistors of the first output control module connected thereto are all turned off; CLK2 becomes the high level from the low level, as an output voltage increases, an voltage at the PU node is bootstrapped to a higher level by a capacitor connected between the gate of T1 and the output terminal OUT(n), so that it is ensured that there is no threshold loss in the output voltage at the output terminal OUT(n), and the PD node keeps at the low level to maintain T2 off and in turn it avoids the electric leakage of the high level outputted at the output terminal OUT(n) through T2; and A third phase is a resetting phase, in a third half clock cycle, CLK2 becomes the low level and CLK1 becomes the high level, the PU node is discharged to the low level and the PD node is recharged to the high level, T1 is turned off and T2 is turned on at this time, so that the output voltage at the output terminal OUT(n) becomes the low level via T2.

It can be known from FIG. 1B, the PU node and the PD node have an opposite relationship, so that it is avoided that T1 and T2 are turned on simultaneously to cause abnormal output.

However, if T1 and T2 in FIG. 1A are depletion type transistors, a large distortion occurs in the output voltage. First, in the evaluating phase, the voltage at PU node is at the high level and thus T1 is turned on, on the other hand, T2 cannot be turned off normally but generates a leakage current due to the depletion characteristics of T2 although the gate-source voltage Vgs of T2 is zero since the voltage at the PD node is discharged to the low level VGL, that is, T1 and T2 are turned on simultaneously, and thus the potential of the output voltage outputted at the output terminal depends on the voltage division of T1 and T2 and is usually lower than the normal high voltage too much, which in turn affects normal operations of a shift register at a next stage and may cause malfunction of next stages. Secondly, in the resetting phase, the voltage at the PU node is at the low level and the voltage at the PD node is at the high level, and the output voltage at the output terminal OUT(n) is at the low level; at the same time, T1 is continually turned on as it is the depletion type transistor, and the output voltage at the output terminal OUT(n) would generate a high level pulse and the potential thereof depends on the voltage division of T1 and T2 when CLK2 becomes the high level. A normal waveform of the output voltage at the output terminal OUT(n) is shown by a liquid line in FIG. 1C, and a distorted waveform of the output voltage at the output terminal OUT(n) is shown by a dotted line in FIG. 1C.

Besides the first output transistor T1 and the second output transistor T2, other depletion type TFTs in the internal control circuit would cause abnormal output as well. As shown in FIG. 2A, the second control module is a pulling-down transistor control module, and the first control module includes T3 and T4 which are depletion type transistors, wherein T3 is connected to the output terminal OUT(n−1) of the shift register at a previous stage and the PU node (the node connected to the gate of T1) and functions to charge the voltage at the PU node to the high level in the pre-charging phase; T4 has a gate connected to a reset signal Rst and is connected between the PU node and the low level output terminal for outputting the low level VGL, and functions to pull down the voltage at the PU node in the resetting phase. The depletion type transistors T3 and T4 are turned on in the evaluating phase, the voltage at the PU node is pulled down, so that T1 is not turned on completely, which affects the potential of the output voltage at the output terminal OUT(n), as shown by a dotted line in FIG. 2B.

Therefore, there is a need for improving the circuit structure of the shift register to remove the effect of the depletion type TFT on the output voltage of the shift register.

SUMMARY

Embodiments of the present disclosure provide a shift register unit and a driving method thereof, a shift register and a display apparatus for removing the effect of a leakage current of a depletion type TFT on the shift register.

According to one aspect, there is provided a shift register unit, including:

an input terminal;

a first output control module having a control signal output terminal connected to a pulling-up node, for pulling up a driving signal in an evaluating phase, a second output control module having a control signal output terminal connected to a pulling-down node, for pulling down the driving signal in a resetting phase;

the first output control module is also connected to the input terminal;

characterized in that the shift register unit further includes:

a carry signal output terminal;

a driving signal output terminal;

a staged output module connected to the pulling-up node, the pulling-down node, the carry signal output terminal and the driving signal output terminal, respectively, for outputting a carry signal and a driving signal in stages so that the driving signal maintains at a high level in the evaluating phase and at a low level in the resetting phase; and a pulling-up node level maintaining module for, in the evaluating phase, maintaining the level at the pulling-up node at a high level via the first output control module so that the driving signal maintains the high level.

In an example, the staged output module includes:

a carry signal output unit for making the carry signal output terminal output a first low level under the control of the first output control module in a pre-charging phase and the resetting phase, and making the carry signal output terminal output a high level under the control of the second output control module in the evaluating phase; and a driving signal output unit for making the driving signal output terminal output a high level under the control of the second output control module in the evaluating phase, and making the driving signal output terminal output a second low level under the control of the first output control module in the resetting phase.

In an example, the carry signal output unit includes a first carry signal output TFT and a second carry signal output TFT;

the first carry signal output TFT has a gate connected to the control signal output terminal of the first output control module, a source connected to the carry signal output terminal, and a drain connected to a first clock signal input terminal; and the second carry signal output TFT has a gate connected to the control signal output terminal of the second output control module, a source connected to a first low level output terminal, and a drain connected to the carry signal output terminal.

In an example, the driving signal output unit includes a first driving TFT, a second driving TFT and a bootstrap capacitor;

the first driving TFT has a gate connected to the control signal output terminal of the first output control module, a source connected to the driving signal output terminal, and a drain connected to a first clock signal input terminal;

the second driving TFT has a gate connected to the control signal output terminal of the second output control module, a source connected to a second low level output terminal, and a drain connected to the driving signal output terminal; and the bootstrap capacitor is connected in parallel between the gate and the source of the first driving TFT.

In an example, the first carry signal output TFT, the second carry signal output TFT, the first driving TFT and the second driving TFT are depletion type TFTs.

In an example, a threshold voltage of the first carry signal output TFT, a threshold voltage of the second carry signal output TFT, a threshold voltage of the first driving TFT and a threshold voltage of the second driving TFT are a same depletion threshold voltage;

the first low level is lower than the second low level, and the absolute value of difference between the first low level and the second low level is larger than the absolute value of the depletion threshold voltage.

In an example, the first output control module includes a first TFT, a second TFT, a third TFT and a fourth TFT, wherein a gate and a source of the first TFT are connected to the input terminal, and a drain of the first TFT is connected to a source of the second TFT;

a gate of the second TFT is connected to the input terminal, and a drain of the second TFT is connected to a drain of the fourth TFT;

a gate of the third TFT is connected to a reset signal output terminal, a source of the third TFT is connected to the first low level output terminal, and a drain of the third TFT is connected to a source of the fourth TFT;

a gate of the fourth TFT is connected to the reset signal output terminal;

wherein the drain of the first TFT is also connected to the pulling-up node level maintaining module; and the drain of the second TFT is connected to the control signal output terminal of the first output control module.

In an example, the second output control module includes a first output control TFT, a second output control TFT, and a third output control TFT, wherein a gate of the first output control TFT is connected to the gate of the first carry signal output TFT, a source of the first output control TFT is connected to a drain of the second output control TFT, and a drain of the first output control TFT is connected to the gate of the second carry signal output TFT;

a gate of the second output control TFT is connected to the gate of the first carry signal output TFT, and a source of the second output control TFT is connected to the first low level output terminal;

a gate and a drain of the third output control TFT are connected to a high level output terminal, and a source of the third output control TFT is connected to the gate of the second carry signal output TFT.

In an example, the pulling-up node level maintaining module includes:

a first feedback control TFT having a gate connected to the carry signal output terminal, a source connected to the drain of the first TFT, and a drain connected to a first node (FN);

wherein the first feedback control TFT is a depletion type TFT;

a threshold voltage of the first feedback control TFT is aa depletion threshold voltage; and the first low level is lower than the second low level, and the absolute value of difference between the first low level and the second low level is larger than the depletion threshold voltage.

In an example, the shift register unit according to the embodiments of the present disclosure further includes a cutting-off control signal input terminal and a cutting-off control signal output terminal;

the pulling-up node level maintaining module further includes a second feedback control TFT;

a gate of the second feedback control TFT is connected to the carry signal output terminal, a source of the second feedback control TFT is connected to the first node (FN), and a drain of the second feedback control TFT is connected to the cutting-off control signal output terminal; and the second output control module is connected to the cutting-off control signal input terminal.

In an example, the first node (FN) is connected to the driving signal output terminal.

In an example, the staged output module further includes a staged output unit connected between the carry signal output unit and the driving signal output unit.

In an example, the staged output unit includes a first staged output TFT and a second staged output TFT;

a gate of the first staged output TFT is connected to the gate of the first carry signal output TFT, a drain of the first staged output TFT is connected to the first clock signal input terminal, and a source of the first staged output TFT is connected to the first node (FN); and a gate of the second staged output TFT is connected to the gate of the second carry signal output TFT, a source of the second staged output TFT is connected to the second low level output terminal, and a drain of the second staged output ITT is connected to the source of the first staged output TFT.

According to another aspect, there is provided a driving method applied to the above-described shift register unit, the driving method includes:

in a phase wherein the input terminal inputs a high level, the first clock signal is at a low level, the first output control module controls to pre-charge the bootstrap capacitor, so as to control the carry signal output terminal and the driving signal output terminal to output a first low level; the second output control module controls the control signal output terminal thereof to output the first low level;

in a next half clock cycle, the first clock signal becomes a high level, the first output control module controls the carry signal output terminal and the driving signal output terminal to output a high level; and in a third half clock cycle, the first clock signal becomes the low level, the first output control module and the second output control module control the carry signal output terminal to output the first low level and control the driving signal output terminal to output the second low level.

According to another aspect, there is provided a shift register including a plurality of the above-described shift register units arranged at a plurality of stages;

except the shift register unit at a first stage, the input terminal of the shift register unit at each stage is connected to the carry signal output terminal of the shift register unit at a previous stage.

According to another aspect, there is provided a shift register including a plurality of the above-described shift register units arranged at a plurality of stages;

except the shift register unit at a first stage, the input terminal of the shift register unit at each stage is connected to the carry signal output terminal of the shift register unit at a previous stage; and except the shift register unit at a last stage, the cutting-off control signal input terminal of the shift register unit at each stage is connected to the cutting-off control signal output terminal of the shift register unit at a next stage.

According to another aspect, there is provided a display apparatus including the above-described shift register.

Compared to the prior art, the shift register unit and the driving method thereof, the shift register and the display apparatus of the embodiments of the present disclosure remove the effect of the leakage current of the depletion type TFT on the shift register by using staged output and maintaining the pulling-up node level, which increases stability and reliability thereof and decreases power consumption.

DETAILED DESCRIPTION

In one aspect, the technical solutions and the advantages of the present disclosure more clear, detailed descriptions will be given below in particular embodiments of the present disclosure with reference to accompanying drawings.

The disclosure provides a shift register unit and a driving method thereof, a shift register and a display apparatus for removing the effect of leakage current of depletion type TFTs on the shift register.

Figure 1A:
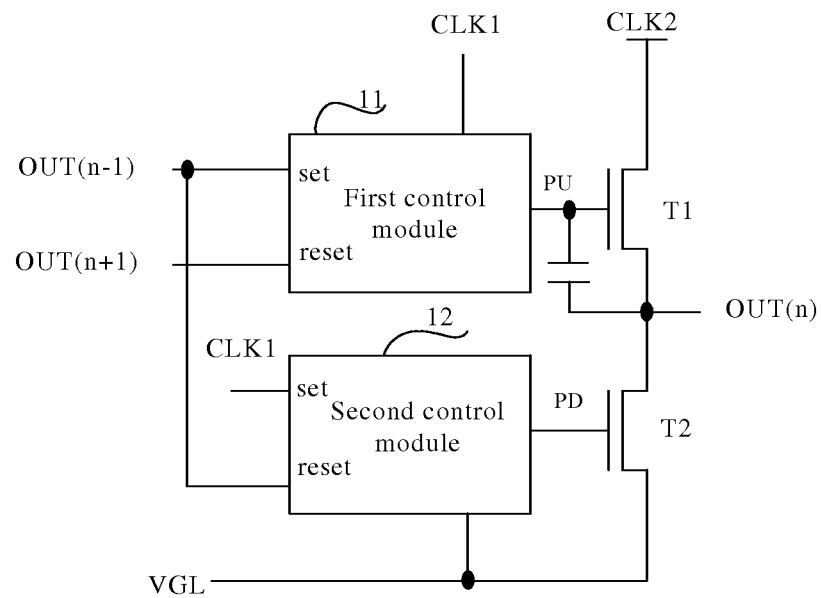
FIG. 1A is a circuit diagram of a conventional shift register.
Figure 1B:
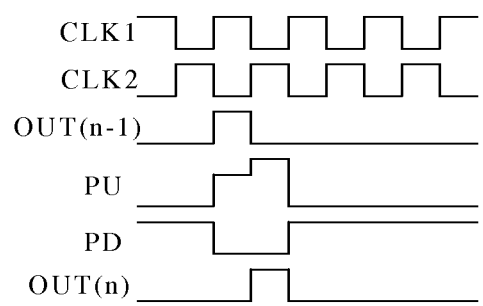
FIG. 1B is a timing sequence diagram of respective signals of the conventional shift register in operation.
Figure 1C:
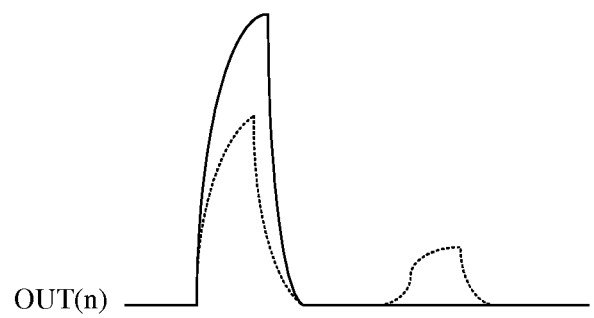
FIG. 1C is an output waveform at an output terminal OUT (n) of the conventional shift register.
Figure 2A:
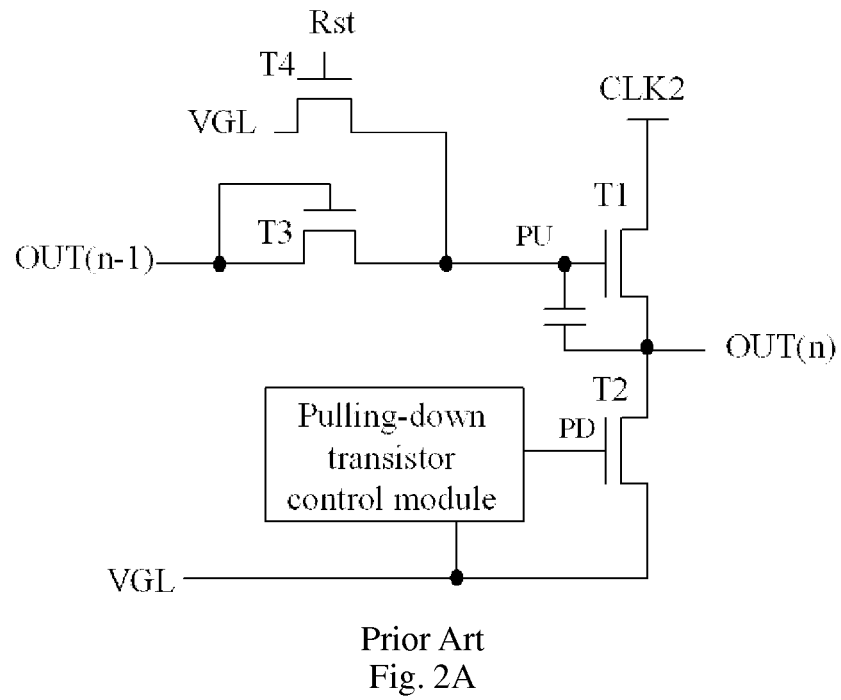
FIG. 2A is a circuit diagram of a particular embodiment of the conventional shift register.
Figure 2B:
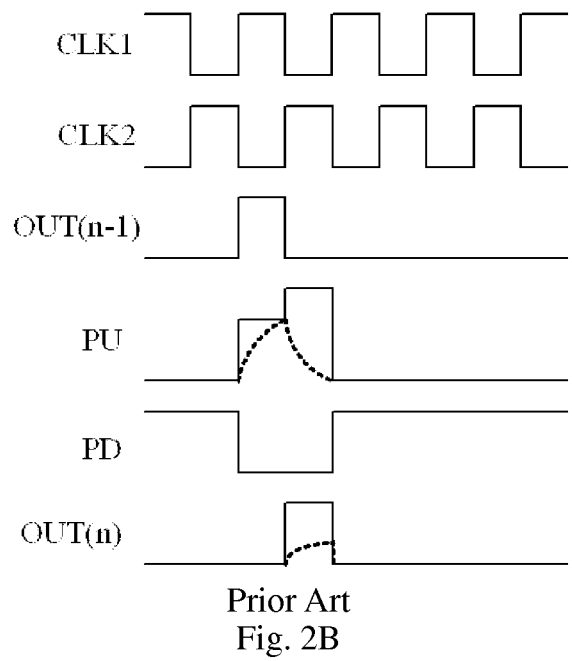
FIG. 2B is a timing sequence diagram of respective signals of the particular embodiment of the conventional shift register in operation.
Figure 3:
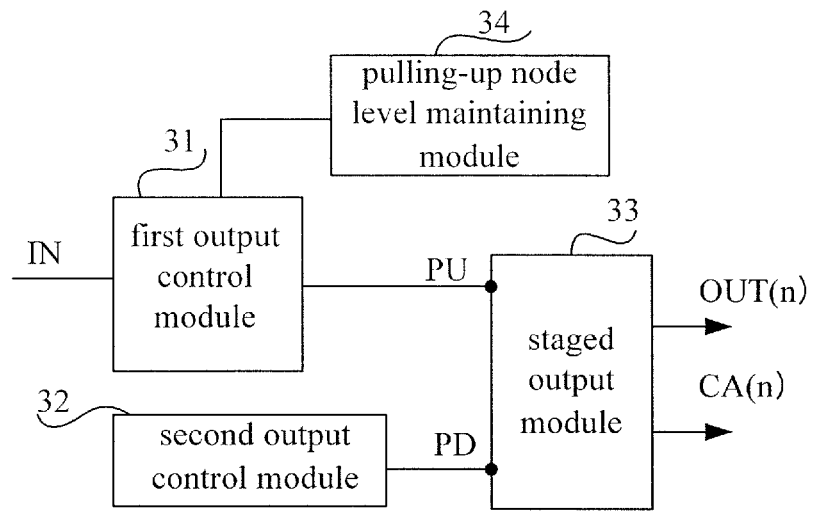
FIG. 3 is a circuit diagram of a shift register unit according to a first embodiment of the present disclosure.

As shown in FIG. 3, according to a first embodiment of the present disclosure, a shift register unit includes:

an input terminal IN;
a carry signal output terminal CA(n);
a driving signal output terminal OUT(n);
a first output control module 31 having a control signal output terminal connected to a PU node (a pulling-up node), for pulling up a driving signal in an evaluating phase, the first output control module 31 also being connected to the input terminal IN;
a second output control module 32 having a control signal output terminal connected to a PD node (a pulling-down node), for pulling down the driving signal in a resetting phase;

the shift register unit according to the first embodiment further includes:

a staged output module 33 connected to the PU node, the PD node, the carry signal output terminal CA(n) and the driving signal output terminal OUT(n), respectively, for outputting a carry signal and a driving signal in stages so that the driving signal maintains a high level in the evaluating phase and a low level in the resetting phase; and a pulling-up node level maintaining module 34 connected to the first output control module 31 and for, in the evaluating phase, maintaining the level at the PD node at the high level via the first output control module 31, so that the driving signal maintains the high level; and the carry signal output terminal CA(n) is connected to the input terminal IN of the shift register unit at a next stage (not shown in FIG. 3).

The shift register unit according to the first embodiment of the present disclosure adopts the staged output module 33 to output the carry signal and the driving signal in stages, so that the driving signal maintains a high level in the evaluating phase and a low level in the resetting phase, as a result, the effect of leakage current of depletion type TFTs on the driving signal of the shift register unit can be removed.

The shift register unit according to the first embodiment of the present disclosure controls the first output control module 31 through the pulling-up node level maintaining module 34 in the evaluating phase to maintain the level of the PU node at the high level and thus maintain the driving signal at the high level, which avoids the pull-up node (PU node) having electric leakage through the internal TFTs in depletion region in the evaluating phase and removes the effect thereof on the output.

Figure 4:
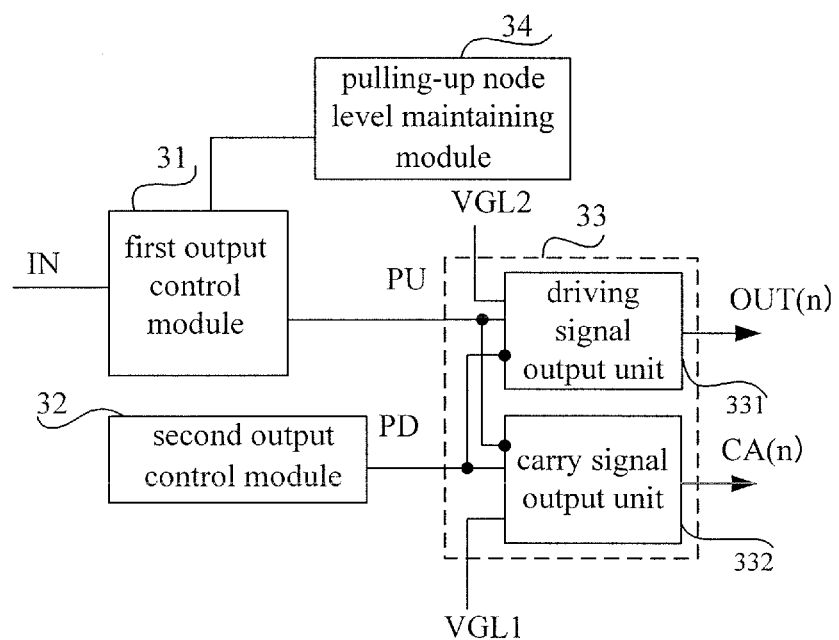
FIG. 4 is a circuit diagram of a shift register unit according to a second embodiment of the present disclosure.

As shown in FIG. 4, a structure diagram of a shift register unit according to a second embodiment of the present disclosure is shown. The shift register unit according to the second embodiment of the present disclosure is based on the shift register unit according to the first embodiment of the present disclosure. In the second embodiment, the staged output module 33 includes a driving signal output unit 331 and a carry signal output unit 332, wherein, the carry signal output unit 332 is driven by a first low level output terminal;
the driving signal output unit 331 is driven by a second low level output terminal;
the carry signal output unit 332 is used for making the carry signal output terminal CA(n) output a first low level VGL1 under the control of the first output control module 31 in a pre-charging phase and the resetting phase, and making the carry signal output terminal CA(n) output the high level under the control of the second output control module 32 in the evaluating phase; and the driving signal output unit 331 is used for making the driving signal output terminal OUT(n) output the high level under the control of the second output control module 32 in the evaluating phase, and making the driving signal output terminal OUT(n) output a second low level VGL2 under the control of the first output control module 31 in the resetting phase.

The first low level output terminal outputs the first low level VGL1, and the second low level output terminal outputs the second low level VGL2; and The first low level VGL1 and the second low level VGL2 are different, so that the effect of leakage current of depletion type TFTs on the driving signal of the shift register unit can be avoided.

Figure 5:
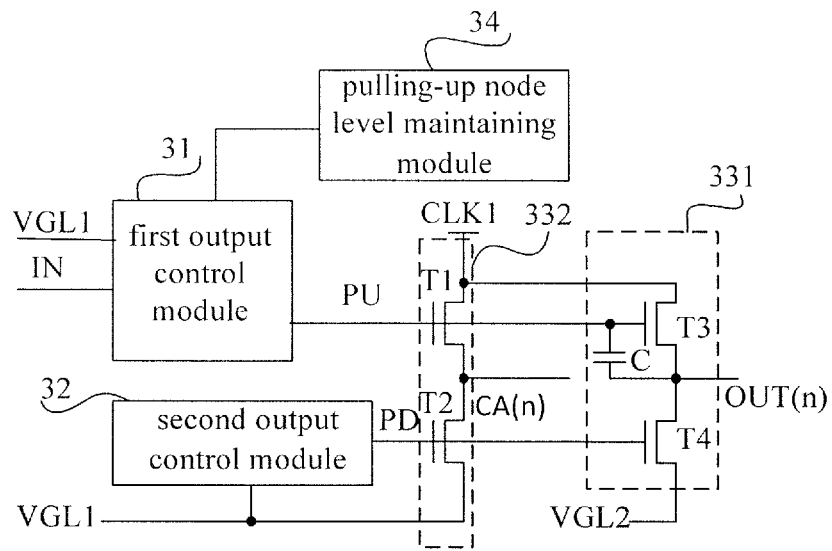
FIG. 5 is a circuit diagram of a shift register unit according to a third embodiment of the present disclosure.

As shown in FIG. 5, a circuit diagram of a shift register unit according to a third embodiment of the present disclosure is shown. The shift register unit according to the third embodiment of the present disclosure is based on the shift register unit according to the second embodiment of the present disclosure. In the third embodiment, the carry signal output unit 332 includes a first carry signal output TFT T1 and a second carry signal output TFT T2;
the driving signal output unit 331 includes a first driving TFT T3, a second driving TFT T4 and a bootstrap capacitor C;
the first carry signal output TFT T1 has a gate connected to the control signal output terminal of the first output control module 31, a source connected to the carry signal output terminal CA(n), and a drain connected to a first clock signal input terminal; and the bootstrap capacitor C is connected in parallel between the gate and the source of the first driving TFT T3;
the first driving TFT T3 has a gate connected to the control signal output terminal of the first output control module 31, a source connected to the driving signal output terminal OUT(n), and a drain connected to a first clock signal input terminal;
the second carry signal output TFT T2 has a gate connected to the control signal output terminal of the second output control module 32, a source connected to the first low level output terminal, and a drain connected to the carry signal output terminal CA(n);
the second driving TFT T4 has a gate connected to the control signal output terminal of the second output control module 32, a source connected to the second low level output terminal, and a drain connected to the driving signal output terminal OUT(n);
the first output control module 31 is further connected to the first low level output terminal and the input terminal IN;
the second output control module 32 is further connected to the first low level output terminal.

Furthermore, T1, T2, T3 and T4 are n-type TFTs.

Furthermore, the first carry signal output TFT T1, the second carry signal output TFT T2, the first driving TFT T3 and the second driving TFT 14 are depletion type TFTs.

Furthermore, a threshold voltage of the first carry signal output TFT T1, a threshold voltage of the second carry signal output TFT T2, a threshold voltage of the first driving TFT T3 and a threshold voltage of the second driving TFT T4 are a same depletion threshold voltage Vth;

wherein the first clock signal CLK1 is inputted from the first clock signal input terminal, the first low level VGL1 is outputted from the first low level output terminal, and the second low level VGL2 is outputted from the second low level output terminal;

wherein VGL1<VGL2 and |VGL1−VGL2|>|Vth|.

Figure 9:
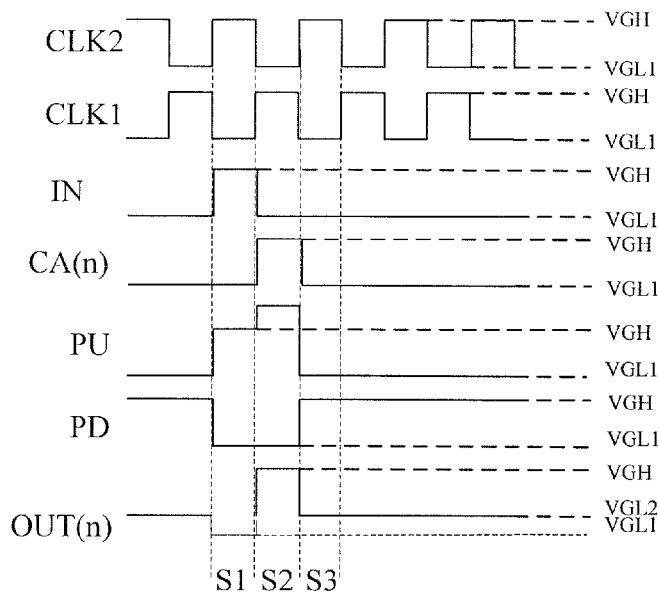
FIG. 9 is a timing sequence diagram of respective signals of the shift register unit according to the second, third, fourth, fifth and sixth embodiments of the present disclosure in operation.

The PU node is a node to which the gate of the first carry signal output TFT T1 is connected, and the PD node is a node to which the gate of the second carry signal output TFT T2 is connected. The potential at the PU node and the potential at the PD node are controlled by the first output control module 31 and the second output control module 32, respectively. A timing sequence diagram of the potential at the PU node and a timing sequence diagram of the potential at the PD node are shown in FIG. 9. The potential at the PU node is generated according to the timing sequence diagram of the potential at the PU node shown in FIG. 9 under the control of the first output control module 31, and the potential at the PD node is generated according to the timing sequence diagram of the potential at the PD node shown in FIG. 9 under the control of the second output control module 32.

In the third embodiment, the first output control module is connected to a second clock signal input terminal (not shown in FIG. 5). In an alternative embodiment, a second clock signal can be omitted and the first output control module can achieve the same functions without being connected to the second clock signal input terminal. The second clock signal CLK2 is inputted from the second clock signal input terminal, and CLK1 and CLK2 have opposite phases.

Figure 6:
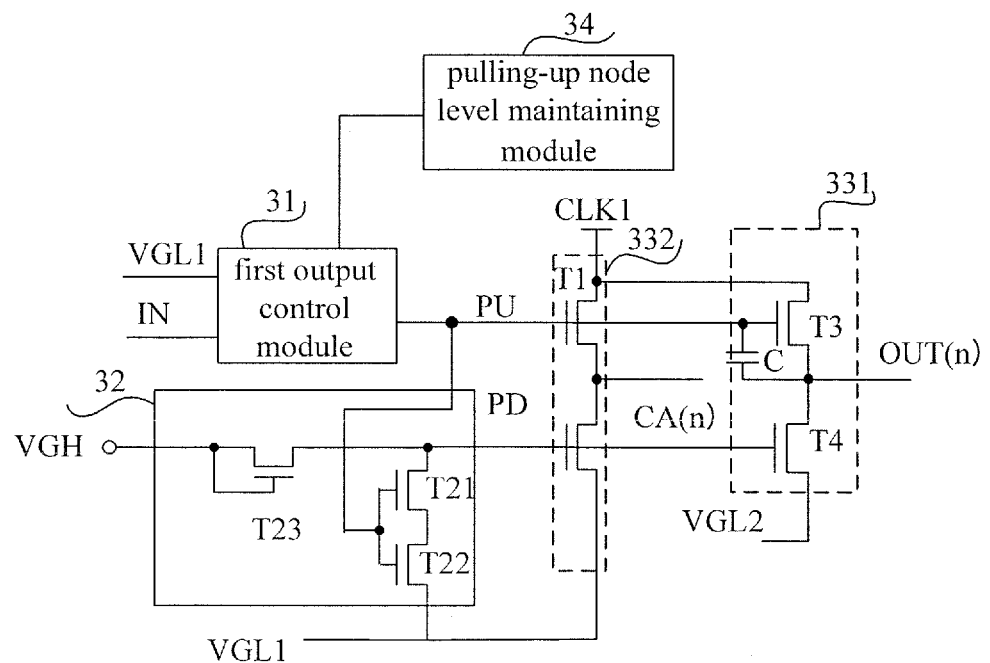
FIG. 6 is a circuit diagram of a shift register unit according to a fourth embodiment of the present disclosure.

As shown in FIG. 6, a circuit diagram of a shift register unit according to a fourth embodiment of the present disclosure is shown. The shift register unit according to the fourth embodiment of the present disclosure is based on the shift register unit according to the third embodiment of the present disclosure. In the fourth embodiment, the second output control module 32 includes a first output control TFT T21, a second output control TFT 122, and a third output control TFT T23, wherein, a gate of the first output control TFT T21 is connected to the gate of the first carry signal output TFT T1, a source of the first output control TFT T21 is connected to a drain of the second output control TFT T22, and a drain of the first output control TFT T21 is connected to the gate of the second carry signal output TFT T2;

a gate of the second output control TFT T22 is connected to the gate of the first carry signal output TFT T1, and a source of the second output control TFT T2 is connected to the first low level output terminal;

a gate and a drain of the third output control TFT T23 are connected to a high level output terminal, and a source of the third output control TFT T23 is connected to the gate of the second carry signal output TFT T2, wherein the high level output terminal outputs a high level VGH.

Figure 7:
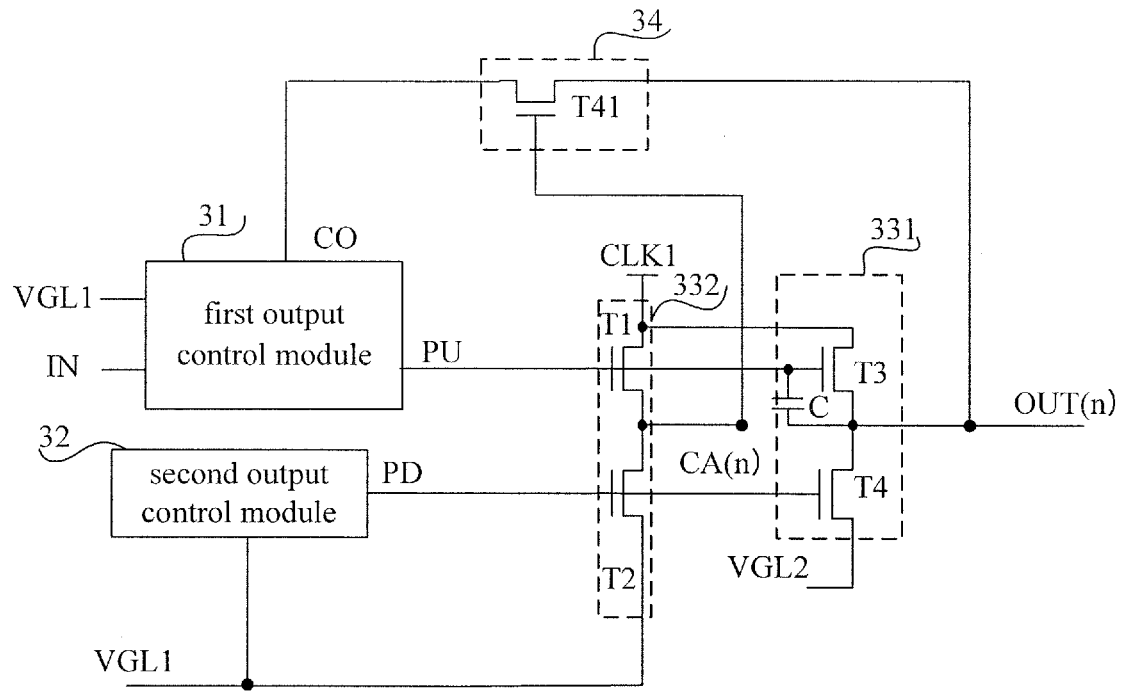
FIG. 7 is a circuit diagram of a shift register unit according to a fifth embodiment of the present disclosure.

As shown in FIG. 7, a circuit diagram of a shift register unit according to a fifth embodiment of the present disclosure is shown. The shift register unit according to the fifth embodiment of the present disclosure is based on the shift register unit according to the third embodiment of the present disclosure. In the fifth embodiment, the first output control module 31 includes a feedback signal receiving terminal CO;

the pulling-up node level maintaining module 34 includes:
a first feedback control TFT T41 having a gate connected to the carry signal output terminal CA(n), a source connected to the feedback signal receiving terminal CO of the first output control module 31, and a drain connected to the driving signal output terminal OUT(n);

wherein the first feedback control TFT T41 is a depletion type TFT;
a threshold voltage of first feedback control TFT T41 is the depletion threshold voltage Vth; and VGL1<VGL2 and |VGL1−VGL2|>|Vth|, so that it is ensured that T41 is turned off in the resetting phase and thus has no effect on the driving signal output terminal.

Figure 8:
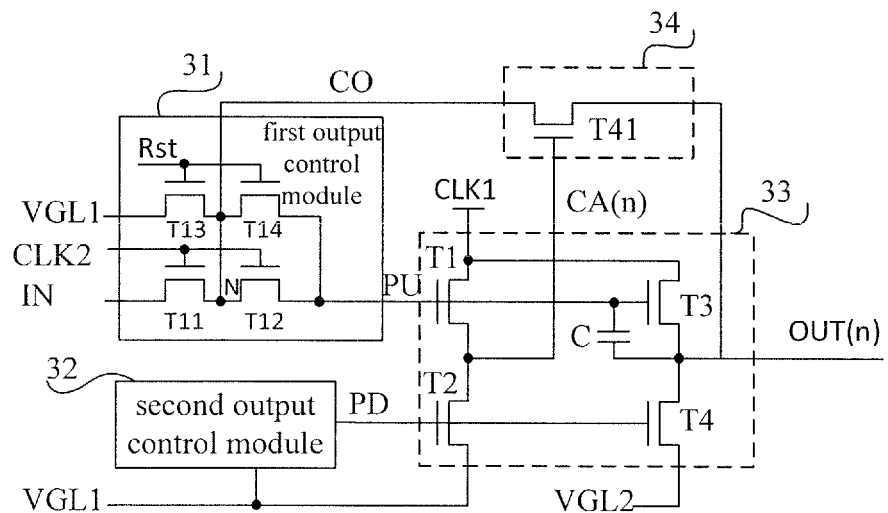
FIG. 8 is a circuit diagram of a shift register unit according to a sixth embodiment of the present disclosure.

As shown in FIG. 8, a circuit diagram of a shift register unit according to a sixth embodiment of the present disclosure is shown. The shift register unit according to the sixth embodiment of the present disclosure includes: a first output control module 31, a second output control module 32, a staged output module 33, a pulling-up node level maintaining module 34, an input terminal IN, a carry signal output terminal CA(n) and a driving signal output terminal OUT(n), wherein, the first output control module 31 has a control signal output terminal connected to a PU node (a pulling-up node), for pulling up a driving signal in an evaluating phase;

the first output control module 31 includes a feedback signal receiving terminal CO;

and it further includes a first TFT T11, a second TFT T12, a third TFT T13 and a fourth TFT T14, wherein a gate of the first TFT T11 is connected to a second clock signal CLK2, a source of the first TFT T11 is connected to the input terminal, and a drain of the first TFT T11 is connected to a source of the second TFT T12;

a gate of the second TFT T12 is connected to the second clock signal CLK2, and a drain of the second TFT T12 is connected to a drain of the fourth TFT T14;

As an alternative embodiment of the embodiment shown in FIG. 8, the gates of T1 and T2 may be not connected to the second clock signal CLK2 but connected directly to the input terminal IN with the same function being achieved. The difference lies in that control of the shift register unit according to the present disclosure will be more flexible and accurate when two clock signals CLK1 and CLK2 are used.

a gate of the third TFT T13 is connected to a reset signal output terminal Rst, a source of the third TFT T13 is connected to the first low level output terminal, and a drain of the third TFT T13 is connected to a source of the fourth TFT T14;

a gate of the fourth TFT T14 is connected to the reset signal output terminal Rst:

wherein the drain of the first TFT T11 is also connected to the feedback signal receiving terminal CO of the first output control module 31;

the drain of the second TFT T12 is also connected to the control signal output terminal of the first output control module 31; and the reset signal output terminal Rst is connected to the second output control module 32 (not shown in FIG. 8).

In FIG. 8, a point N is a connection point where the T11 and T12 are connected in series and is also a connection point where T13 and T14 are connected in series; and the feedback signal receiving terminal CO of the first output control module 31 is connected to the point N;

T11 and T12 are connected in series and function as charging the PU node to a high level;

T13 and T14 are connected in series and function as discharging the PU node to a low level;

the second output control module 32 has a control signal output terminal connected to a PD node (a pulling-down node), for pulling down the driving signal in a resetting phase;

the second output control module 32 is also connected to a first low level output terminal;

the staged output module 33 includes a first carry signal output TFT T1 and a second carry signal output TFT T2;

the driving signal output unit 331 includes a first driving TFT T3, a second driving TFT T4 and a bootstrap capacitor C;

the first carry signal output TFT T1 has a gate connected to the control signal output terminal of the first output control module 31, a source connected to the carry signal output terminal CA(n), and a drain connected to a first clock signal input terminal;

the bootstrap capacitor C is connected in parallel between the gate and the source of the first driving TFT T3;

the first driving TFT 13 has a gate connected to the control signal output terminal of the first output control module 31, a source connected to the driving signal output terminal OUT(n), and a drain connected to a first clock signal input terminal;

the second carry signal output TFT T2 has a gate connected to the control signal output terminal of the second output control module 32, a source connected to the first low level output terminal, and a drain connected to the carry signal output terminal CA(n);

the second driving TFT T4 has a gate connected to the control signal output terminal of the second output control module 32, a source connected to a second low level output terminal, and a drain connected to the driving signal output terminal OUT(n);

the pulling-up node level maintaining module 34 includes a first feedback control TFT T41 having a gate connected to the carry signal output terminal CA(n), a source connected to the feedback signal receiving terminal CO of the first output control module 31, and a drain connected to the driving signal output terminal OUT(n).

FIG. 9 is a timing sequence diagram of signal inputted from CLK1, signal outputted from CA(n), potential at PU node, potential at PD node and signal outputted from OUT(n) of the shift register units according to the second, third, fourth, fifth and sixth embodiments of the present disclosure in operation;

in FIG. 9, VGH refers to the high level.

As shown in FIG. 9, the operation of the shift register unit according to the sixth embodiment of the present disclosure is divided into three phases:

A first phase is a pre-charging phase S1, when the input terminal IN or the second clock signal CLK2 generates a high level pulse, T11 and T12 are turned on and T13 and T14 are turned off, the potential at the PU node is charged to a high level so that T1 and T3 are turned on, and thus the low level (VGL1) of CLK1 is transferred to OUT(n) via the turned-on T3 to ensure that OUT(n) outputs a low level; and the low level (VGL1) of CLK1 is transferred to CA(n) via the turned-on T1 to ensure that CA(n) outputs a low level. Meanwhile, the potential at the PD node connected to the gate of T2 is controlled to be discharged to VGL1, and the output is not affected by the T2 being turned on in the depletion region, since CA(n) outputs the low level VGL1. At this time, T4 is turned off since VGL1<VGL2.

A second phase is an evaluating phase S2, that is, in a next half clock cycle, IN or the second clock signal CLK2 is at the low level, T11 is turned on in the depletion region, CLK1 becomes the high level from the low level. T41 is turned on as the voltages outputted from CA(n) and OUT(n) increase to transfer a high level to the point N; the gate of T12 is at the low level at this time, so for T12, Vgs<0 and thus Vgs<Vth, T12 and 114 are completely turned off, and thus it is ensured that the PU node is in a floating state (that is, no signal is inputted to the PU node since all the transistors in the first output control module 31 connected thereto are turned off), the voltage at the PU node is bootstrapped to a higher level by the bootstrap capacitor, so that it is ensured that there is no threshold loss in the output voltage at OUT(n); at this time, the potential at the PD node keeps at the low level to maintain T4 being turned off and in turn avoid the high level outputted from OUT(n) having electric leakage through T4; and the stability of the driving output signal from OUT(n) can be ensured although CA(n) is effected to a certain extent by T2 being turned on in the depletion region.

A third phase is a resetting phase S3, that is, in a third half clock cycle, CLK1 becomes the low level, T13 and T14 are turned on by the reset signal outputted from the reset signal output terminal Rst (the reset signal may be generated by the second output control module 32 or supplied from outside), the PU node is discharged to a low level VGL1 and the PD node is recharged to a high level, T1 is turned on in the depletion region and T2 is turned on at this time, so the carry signal outputted from CA(n) keeps at the low level; T4 is turned on, and T3 is turned on in the depletion region, so the driving output signal outputted from OUT(n) keeps at the low level VGL2. Therefore, T41 is turned off since VGL1<VGL2 and |VGL1−VGL2|>|Vth|, and it has no effect on the driving output.

The output is divided into two stages in the shift register unit according to the above described embodiments of the present disclosure: the carry signal output unit and the driving signal output unit, and the carry signal output unit and the driving signal output unit are driven by the first low level output terminal and the second low level output terminal, respectively, wherein the low levels outputted from the first low level output terminal and the second low level output terminal are different, therefore it is avoided that the output is affected by the leakage current generated by T3 and T4 being turned on in the depletion region. Meanwhile, internal nodes are controlled by the first feedback control TFT T41 in the present disclosure, so that it is avoided that the PU node has a electric leakage through internal TFTs being turned on in the depletion region in the evaluating phase and that the output is affected; and the source control voltage and the gate control voltage of the first feedback control TFT T41 are controlled by different low levels, so that it is avoided that the output is inversely affected by the variation in potential at the internal nodes. It is not necessary for T1 and T2 to have large size since T1 and T2 are only used to drive the carry signal output terminal.

Figure 10:
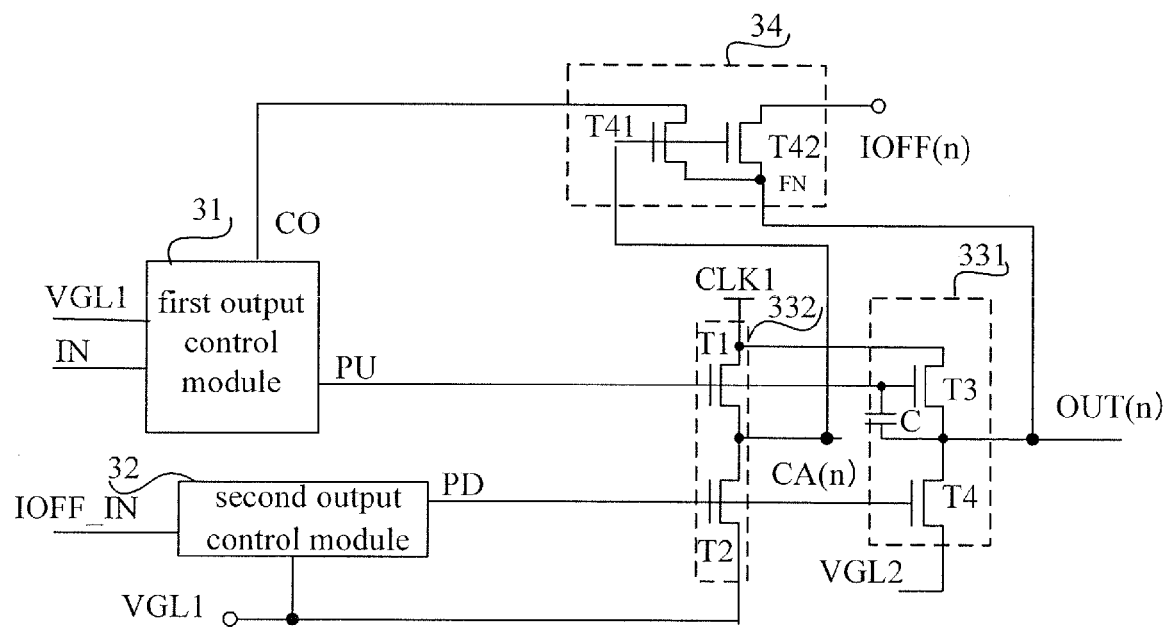
FIG. 10 is a circuit diagram of a shift register unit according to a seventh embodiment of the present disclosure.

FIG. 10 is a circuit diagram of a shift register unit according to a seventh embodiment of the present disclosure, and the shift register unit according to the seventh embodiment of the present disclosure is based on the shift register unit according to the fifth embodiment of the present disclosure.

As shown in FIG. 10, the shift register unit according to the seventh embodiment of the present disclosure further includes a cutting-off control signal input terminal IOFF_IN and a cutting-off control signal output terminal IOFF(n);

the pulling-up node level maintaining module 34 further includes a second feedback control TFT T42;

a gate of the second feedback control TFT T42 is connected to the carry signal output terminal CA(n), a source of the second feedback control TFT T42 is connected to the driving signal output terminal OUT(n), and a drain of the second feedback control TFT T42 is connected to the cutting-off control signal output terminal IOFF(n); and the second output control module 32 is connected to the cutting-off control signal input terminal IOFF_IN.

The cutting-off control signal output terminal IOFF(n) is connected to the cutting-off control signal input terminal IOFF_IN of the shift register unit at a previous stage (not shown in FIG. 10), and the outputted cutting-off control signal is used for controlling the second output control module of the shift register unit at the previous stage to cut off the electric leakage path of the PD node.

Figure 11:
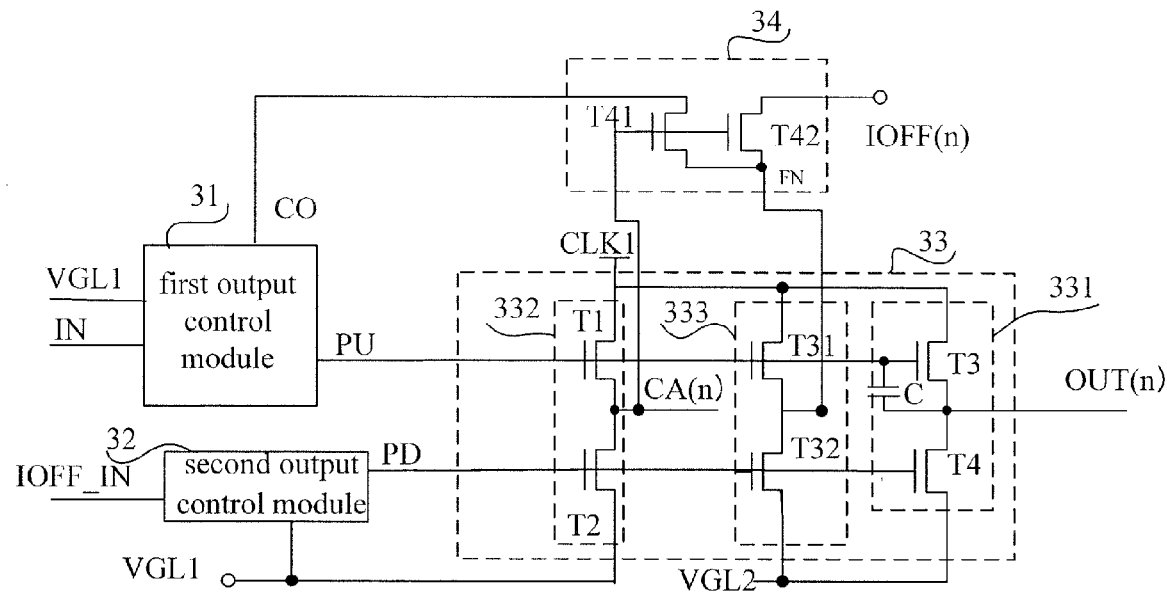
FIG. 11 is a circuit diagram of a shift register unit according to an eighth embodiment of the present disclosure.

FIG. 11 is a circuit diagram of a shift register unit according to an eighth embodiment of the present disclosure, and the shift register unit according to the eighth embodiment of the present disclosure is based on the shift register unit according to the seventh embodiment of the present disclosure.

As shown in FIG. 11 in the shift register unit according to the eighth embodiment of the present disclosure, the staged output module 33 further includes a staged output unit 333 connected between the carry signal output unit 332 and the driving signal output unit 331: and a first staged output ITT T31 and a second staged output TFT T32;

wherein a gate of the first staged output TFT T31 is connected to the gate of the first carry signal output TFT T1, a drain of the first staged output TFT T31 is connected to the first clock signal input terminal, and a source of the first staged output TFT T31 is connected to the source of the second feedback control TFT T42; and a gate of the second staged output TFT T32 is connected to the gate of the second carry signal output TFT T2, a source of the second staged output TFT T32 is connected to the second low level output terminal, and a drain of the second staged output TFT T32 is connected to the source of the first staged output TFT T31.

In the eighth embodiment, in order to avoid the effects of T41 and T42 on OUT(n), the staged output module 33 is further divided into three stages so as to further ensure no electric leakage in the output.

Figure 12:
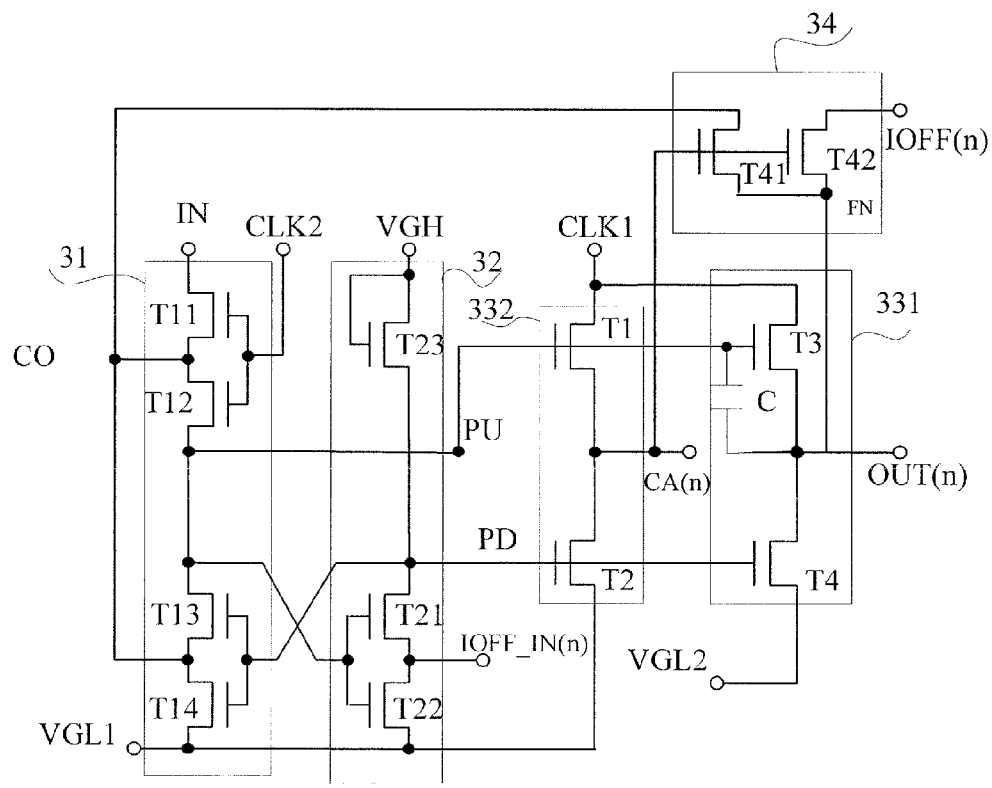
FIG. 12 is a circuit diagram of a shift register unit according to a ninth embodiment of the present disclosure.

FIG. 12 is a circuit diagram of a shift register unit according to a ninth embodiment of the present disclosure, and the shift register unit according to the ninth embodiment of the present disclosure is based on the shift register unit according to the eighth embodiment of the present disclosure.

As shown in FIG. 12, the first output control module includes a first TFT T11, a second TFT T12, a third TFT T13 and a fourth TFT T14; the second output control module includes a first output control TFT T21, a second output control TFT T22, and a third output control TFT T23;

a gate of the first TFT T11 is connected to a second clock signal input terminal, a source of the first TFT T11 is connected to a drain of the second TFT T12, and a drain of the first TFT T11 is connected to the input terminal IN;

a gate of the second TFT T12 is connected to the second clock signal input terminal, and a source of the second TFT T12 is connected to the gate of the first carry signal output TFT T1;

a gate of the third TFT T13 is connected to the gate of the second carry signal output TFT T2, a source of the third TFT T13 is connected to a drain of the fourth TFT T14, and a drain of the third TFT T13 is connected to a gate of the first output control TFT T21;

a gate of the fourth TFT T14 is connected to the gate of the second carry signal output TFT T2; and a source of the fourth TFT T14 is connected to the first low level output terminal;

a gate of the first output control TFT T21 is connected to the gate of the first carry signal output TFT T1, a source of the first output control TFT T21 is connected to the cutting-off control signal input terminal IOFF_IN(n) and a drain of the second output control TFT T22 respectively, and a drain of the first output control TFT T21 is connected to the gate of the second carry signal output TFT T2;

a gate of the second output control TFT T22 is connected to the gate of the first carry signal output TFT T1, and a source of the second output control TFT T2 is connected to the first low level output terminal;

a gate and a drain of the third output control TFT T23 are connected to a high level output terminal, and a source of the third output control TFT T23 is connected to the gate of the second carry signal output TFT T2, wherein the second clock signal input terminal inputs the second clock signal CLK2 having an opposite phase to CLK1, the high level output terminal outputs a high level VGH.

Furthermore, the second output control module, its connection relationship, external signals, etc. shown in FIG. 12 are suitable to the shift register units according to the first, second, third, fifth, sixth, seventh, and eighth embodiments of the present disclosure.

Figure 13:
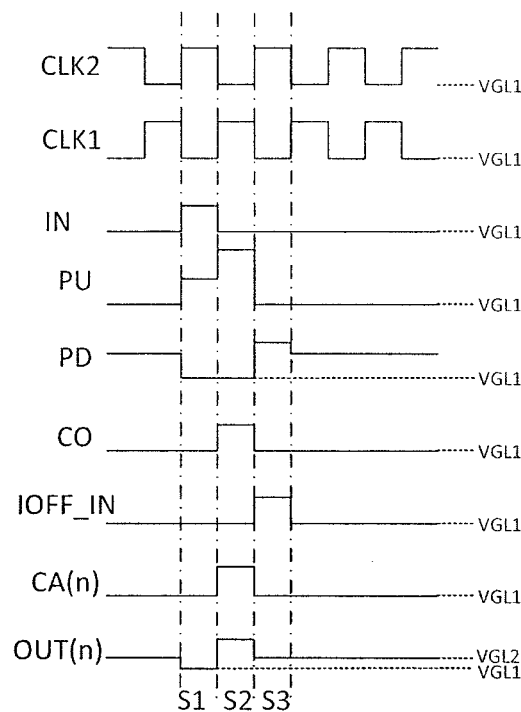
FIG. 13 is a timing sequence diagram of respective signals of the shift register unit according the ninth embodiment of the present disclosure in operation.

FIG. 13 is a timing sequence diagram of signals inputted from CLK2, CLK1 and 1N, potential at PU node, potential at PD node, signal outputted from CO, signal inputted from IOFF_IN(n), signal outputted from CA(n), and signal outputted from OUT(n) of the shift register unit according to the ninth embodiment of the present disclosure in operation, wherein S1, S2 and S3 refer to a pre-charging phase, an evaluating phase and a resetting phase, respectively.

Figure 14:
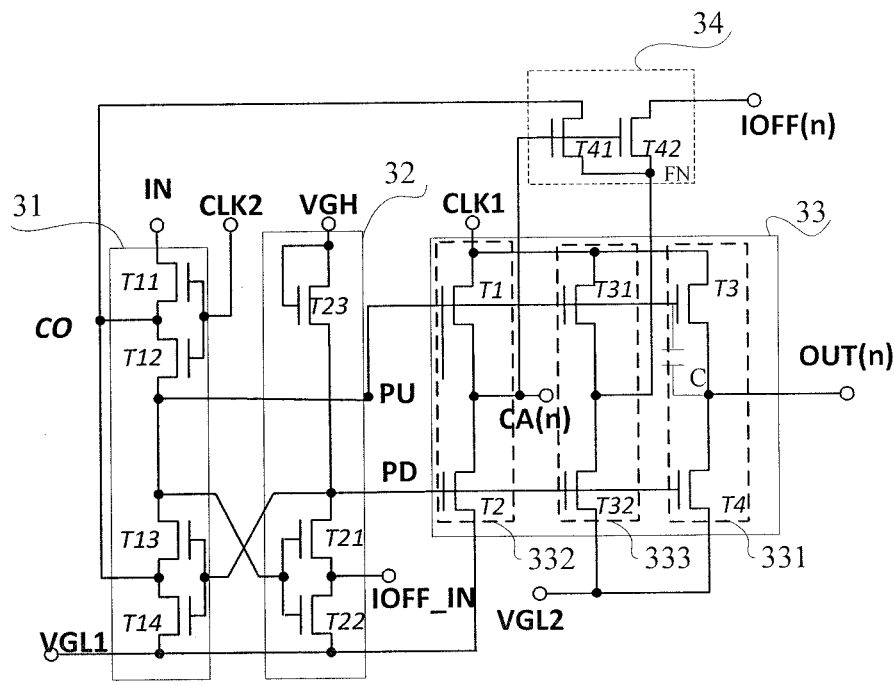
FIG. 14 is a circuit diagram of a shift register unit according to a tenth embodiment of the present disclosure.

FIG. 14 is a circuit diagram of a shift register unit according to a tenth embodiment of the present disclosure, and the shift register unit according to the tenth embodiment of the present disclosure is based on the shift register unit according to the ninth embodiment of the present disclosure.

As shown in FIG. 14, in the shift register unit according to the tenth embodiment of the present disclosure, in order to further avoid the effects of T41 and T42 on OUT(n), the output is divided into three stages so as to further ensure no electric leakage in the output.

The shift register unit according to the tenth embodiment of the present disclosure further includes a first staged output TFT T31 and a second staged output TFT T32;

wherein a gate of the first staged output TFT T31 is connected to the gate of the first carry signal output TFT T1, a drain of the first staged output TFT T31 is connected to the first clock signal input terminal, and a source of the first staged output TFT T31 is connected to the source of the second feedback control TFT T42; and a gate of the second staged output TFT T32 is connected to the gate of the second carry signal output TFT T2, a source of the second staged output TFT T32 is connected to the second low level output terminal, and a drain of the second staged output TFT T32 is connected to the source of the first staged output TFT T31.

Figure 15:
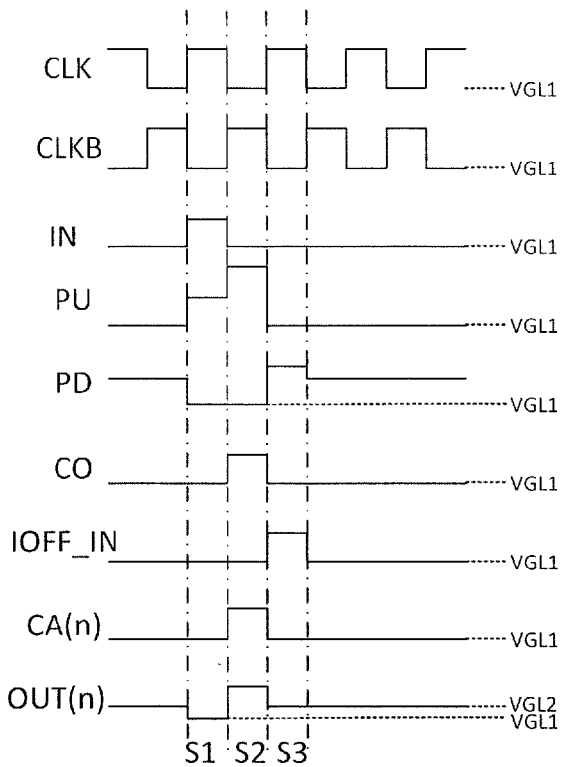
FIG. 15 is a timing sequence diagram of respective signals of the shift register unit according the tenth embodiment of the present disclosure in operation.

FIG. 15 is a timing sequence diagram of signals inputted from CLK2, CLK1 and IN, potential at PU node, potential at PD node, signal outputted from CO, signal inputted from TOFF_IN(n), signal outputted from CA(n), and signal outputted from OUT(n) of the shift register unit according to the tenth embodiment of the present disclosure in operation, wherein S1, S2 and S3 refer to a pre-charging phase, an evaluating phase and a resetting phase, respectively.

Figure 16:
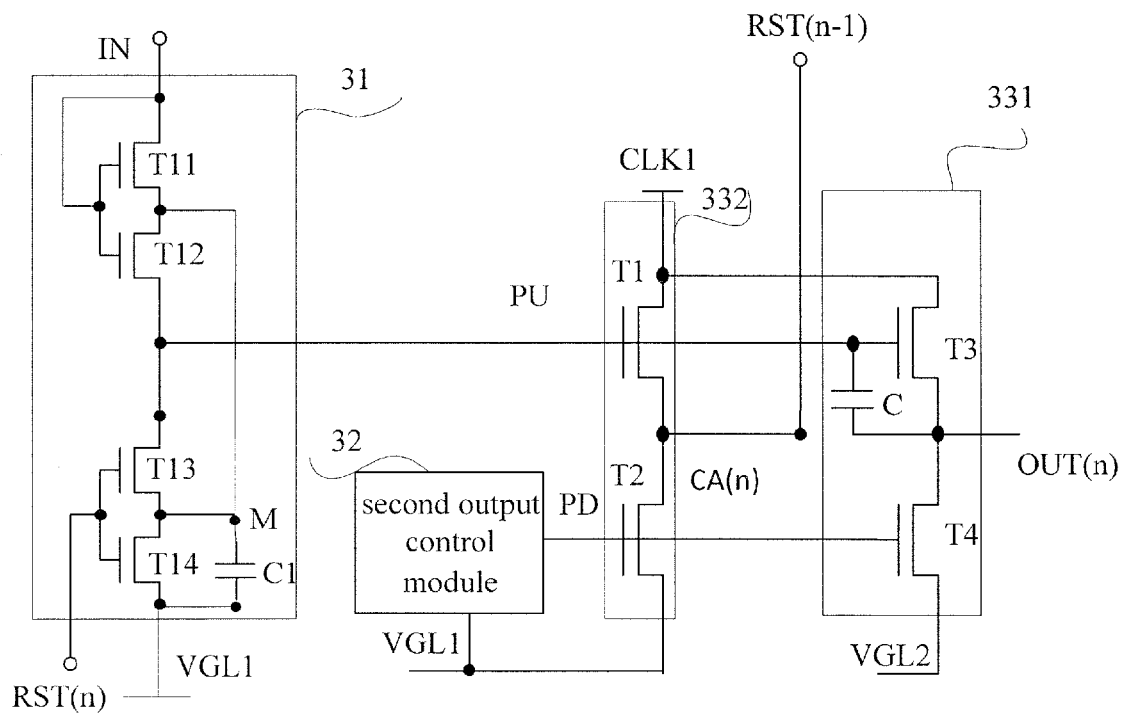
FIG. 16 is a circuit diagram of a shift register unit according to an eleven embodiment of the present disclosure.

FIG. 16 is a circuit diagram of a shift register unit according to an eleventh embodiment of the present disclosure, and the shift register unit according to the eleventh embodiment of the present disclosure is based on the shift register unit according to the third embodiment of the present disclosure.

In the shift register unit according to the eleventh embodiment of the present disclosure, the first output control module 31 includes a first TFT T11, a second TFT T12, a third TFT T13 and a fourth ITT T14, wherein a gate of the first TFT T11 is connected to the input terminal IN, a source of the first TFT T11 is connected to the input terminal IN, and a drain of the first TFT T11 is connected to a source of the second TFT T12:

a gate of the second TFT T12 is connected to the input terminal IN, and a source of the second TFT T12 is connected to a drain of the fourth TFT T14;

a gate of the third TFT T13 is connected to a reset signal output terminal Rst(n), a drain of the third TFT T13 is connected to a drain of the second TFT T12, and a source of the third TFT T13 is connected to the drain of the fourth TFT T14;

a gate of the fourth TFT T14 is connected to the reset signal output terminal Rst(n);

the pulling-up node level maintaining module 34 includes a potential stabilizing capacitor C1 having a first terminal connected to the first low level output terminal and a second terminal connected to the drain of the first TFT T11 and the source of the third TFT T13.

In FIG. 16, a point M is a node connected to the second terminal of the potential stabilizing capacitor C1;

The carry signal output terminal CA(n) is also connected to the reset signal output terminal RST(n−1) of the shift register unit at a previous stage.

Figure 17:
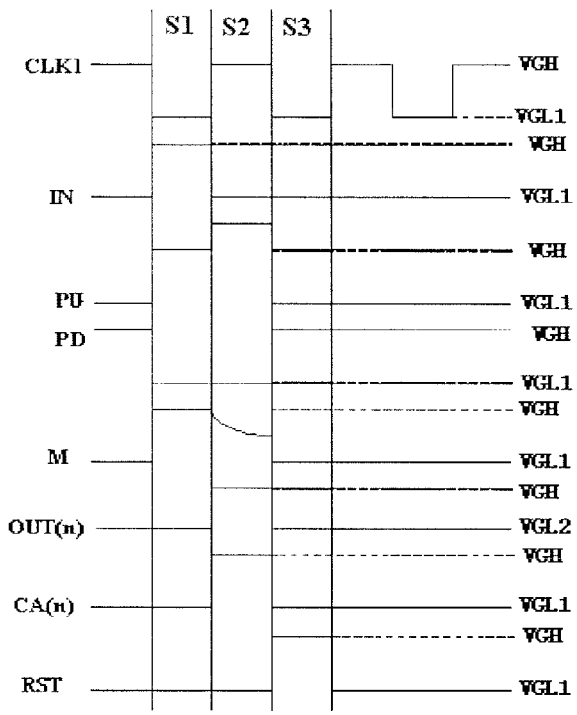
FIG. 17 is a timing sequence diagram of respective signals of the shift register unit according the eleven embodiment of the present disclosure in operation.

As shown in FIG. 17, the operation of the shift register unit according to the eleventh embodiment of the present disclosure is divided into three phases:

A first phase is a pre-charging phase S1, the first clock signal output terminal and the reset signal output terminal RST(n) output a first low level VGL1, and the input terminal IN inputs a high level VGH, T11 and T12 are turned on so that the bootstrap capacitor C is charged through the PU node and C1 is charged through the point M; Vgs (gate-source voltage) of T14 is zero since the voltage at the source of T14 is VGL1 and the potential at RST(n) is also VGL1, and T14 is turned on to a certain extent (referring to its characteristic graph, it can be seen that T14 is in the linear operation region and has a certain resistance); the potential at the point M increases rapidly as C1 is charged by the input terminal IN, Vgs of T13 is lower than zero since the potential at the source of T13 is the potential at the point M and the potential at the gate of T13 is VGL1, and thus T13 is completely turned off after the potential at the point M increase to a certain value, then the potential at the PU node will reach VGH in a short time; Vgs of T2 is zero since the potential at the PD node is VGL1 and T2 is turned on; Vgs of T4 is lower than zero since VGL2>VGL1 and T4 is turned off. As the potential at the PU node increases, T1 and T3 are turned on. OUT(n) outputs the low level VGL1 and CA(n) outputs the low level VGL1;

A second phase is an evaluating phase S2: CLK1 jumps to a high level, the potential at the input terminal IN jumps to the first low level VGL1, RST(n) still outputs the first low level VGL1, Vgs of T11 and Vgs of T14 are zero, and thus T11 and 114 are turned on to a certain extent (that is, T11 and T14 are in the linear operation region and have a resistance); the potentials of the gates of T12 and T13 are VGL1, the potentials of the sources of the T12 and T13 are the potential at the point M, the point M is connected to C1 and the potential at the point M decreases slowly rather than jumping to VGL1 rapidly although C1 is discharged through T11 and T14 slowly, and the potential difference across C1 can be maintained larger than VGL1 in a half pulse width period only if the potential difference across C1 is larger than a certain value, thus the gate-source voltage Vgs of T12 and the gate-source Vgs of T13 are lower than zero and it is ensured that T12 and T13 are turned off, which in turn makes the potential at the PU node unchanged and being at the high level, as a result, T1 and T3 continue to be turned on and the potential at the PD node continues to be maintained at the low level VGL1, and T4 continues to be turned off and T2 keeps to be turned on to a certain extent, at this time, CLK1 is at the high level, the potential at the PU node further increases through C, T1 and T3 are further turned on, so OUT(n) outputs the high level VGH and CA(n) outputs the high level VGH;

A third phase is a resetting phase S3: CLK1 jumps the first low level VGL1, RST(n) and the PD node output the high level VGH, 12 and T4 are turned on fully and T13 and T14 are turned on fully, so the potentials of the PU node and the point M are pulled down to VGL1, OUT(n) outputs VGL2 and CA(n) outputs VGL1 since T2 and T4 are turned on.

At this point, the operation of the shift register unit ends, after the potential at the PU node is pulled down to VGL1, Vgs of T3 is lower than zero since OUT(n) outputs VGL2 and T3 is turned off, and the output of OUT(n) will not be affected when CLK1 becomes a high level again. CA(n) outputs VGL1 since T2 is turned on, although T1 may be turned on slightly.

Figure 18:
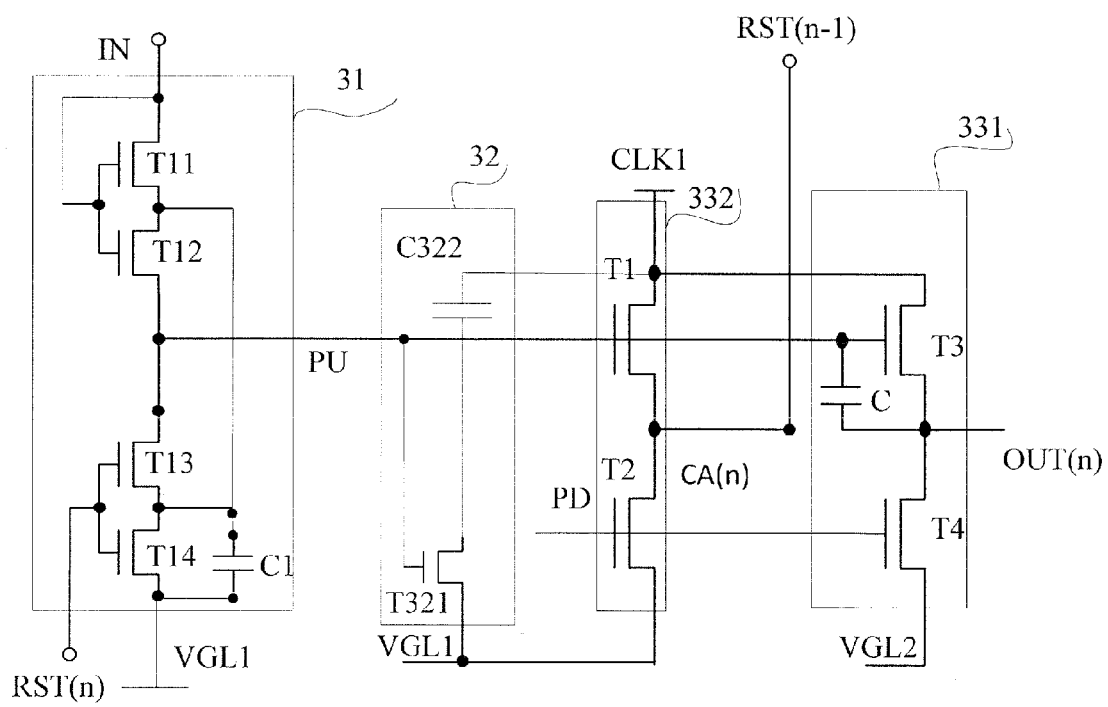
FIG. 18 is a circuit diagram of a shift register unit according to a twelve embodiment of the present disclosure.

FIG. 18 is a circuit diagram of a shift register unit according to a twelfth embodiment of the present disclosure, and the shift register unit according to the twelfth embodiment of the present disclosure is based on the shift register unit according to the eleventh embodiment of the present disclosure.

In the twelfth embodiment, the second output control module 32 includes an output control TFT T321 and an output control capacitor C322, wherein a gate of the output control TFT T321 is connected to the PU node, a source of the output control TFT T321 is connected to the first low level output terminal, a drain of the output control TFT T321 is connected to a first terminal of the output control capacitor C322;

the first terminal of the output control capacitor C322 is connected to the drain of the output control TFT T321, and a second terminal of the output control capacitor C322 is connected to the first clock signal output terminal.

Figure 19:
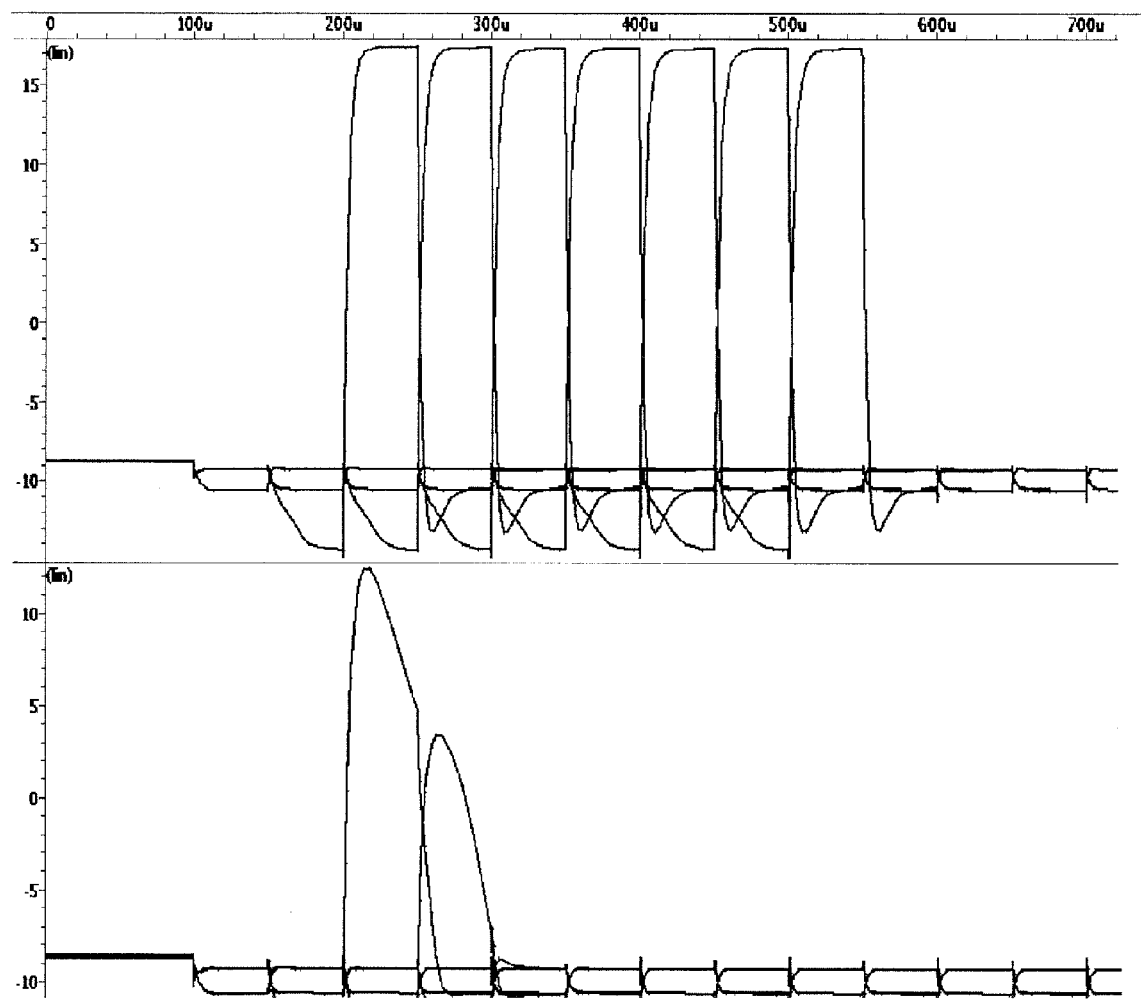
FIG. 19 is a diagram schematically showing the simulation results for the circuit structure according to the present disclosure and the conventional circuit structure with the depletion type TFTs.

FIG. 19 shows the simulation results of the structure adopted in the present disclosure and the conventional structure for the depletion type TFT. As an example, the threshold voltage of TFT is −2V. In FIG. 19, the horizontal axis represents time, and the vertical axis represents output voltage of the shift register, lin represents that the coordinate is a linear coordinate, and u represents that the unit of time is a microsecond. Graphs in the upper portion of FIG. 19 show the simulation result of the shift register unit according to the disclosure for the depletion type TFT, and graphs in the lower portion of FIG. 19 show the simulation result of the conventional shift register unit for the depletion type TFT. From the comparison between the simulation results of the shift register unit according to the disclosure and of the conventional shift register unit for the depletion type TFT, it can be known that the output of the conventional shift register unit attenuates and distorts rapidly due to the effect of the depletion type TFT, whereas the shift register unit according to the embodiments of the present disclosure operates normally. According to the comparison of the simulation results for the internal node Q, in the conventional shift register unit, the voltage at the point Q is discharged by the depletion type TFT in the evaluating phase, which is the immediate cause for the abnormal output; whereas the voltage at the point Q keeps normal in the shift register unit according to the embodiments of the present disclosure, which means the electric leakage of the depletion type TFT is suppressed effectively.

In the present disclosure, there is further provided a driving method applied to the shift register units according to the fifth to tenth embodiments of the present disclosure, the driving method includes:

a pre-charging step: in a period wherein the input terminal inputs a high level, the first clock signal is at a low level, the first output control module controls to pre-charge the bootstrap capacitor so as to turn the first carry signal output TFT and the first driving TFT on, and controls the carry signal output terminal and the driving signal output terminal to output a first low level so as to turn off the first feedback control TFT; the second output control module controls the control signal output terminal thereof to output the first low level, so as to turn on the second carry signal output TFT and turn off the second driving TFT;

an evaluating step: in next half clock cycle, the first clock signal becomes a high level, the first output control module controls the carry signal output terminal and the driving signal output terminal to output a high level, so as to turn on the first feedback control TFT and make the gate of the first carry signal output TFT in a floating state; and a resetting step: in a third half clock cycle, the first clock signal becomes a low level, the first output control module controls the first carry signal output TFT and the first driving TFT to be turned on, the second output control module controls the second carry signal output TFT and the second driving TFT to be turned on, so as to make the carry signal output terminal output the first low level and the driving signal output terminal output the second low level.

In the present disclosure, there is further provided a shift register including a plurality of the above described shift register units arranged at a plurality of stages;

Except the shift register unit at a first stage, the input terminal of the shift register unit at each stage is connected to the carry signal output terminal of the shift register unit at a previous stage.

Figure 20:
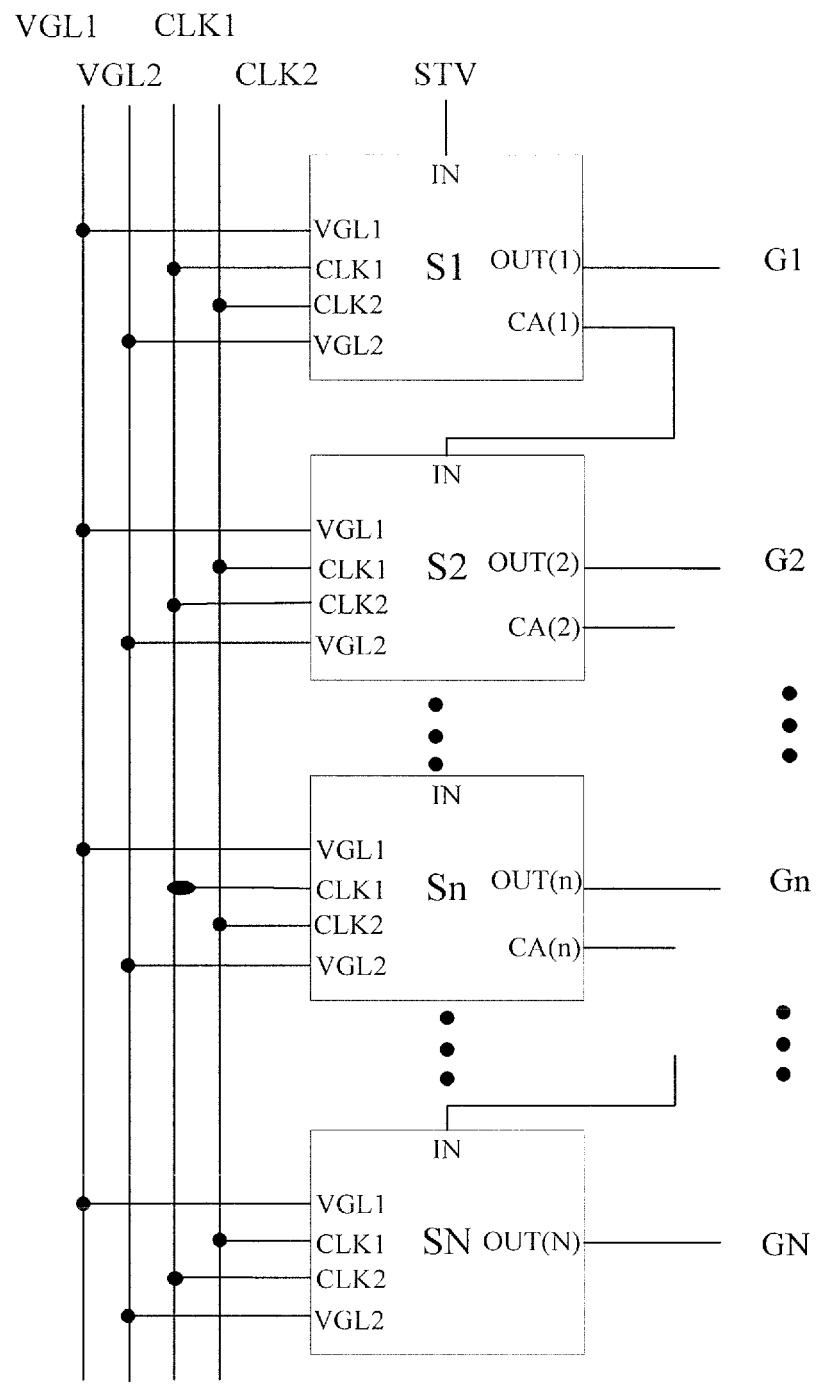
FIG. 20 is a circuit diagram of a shift register according to a first embodiment of the present disclosure.

As shown in FIG. 20, the shift register according to a first embodiment of the present disclosure is constituted by the shift register units at N stages and functions as a row scanner of an active matrix, wherein N is usually the number of rows of the active matrix, and N is an integer;

S1, S2, . . . , Sn, Sn represent the shift register unit at a first stage, the shift register unit at a second stage, the shift register unit at an $n^{th}$ stage, . . . , and the shift register unit at an $N^{th}$ stage;

each of the shift register units is connected to the first clock signal input terminal, the second clock signal input terminal, the first low level output terminal and the second low level output terminal;

the clock signal inputted from the first clock signal input terminal and the clock signal inputted from the second clock signal input terminal have opposite phases and a duty ratio 50%;

wherein the input terminal IN of the shift register unit at the first stage is connected to an initial pulse signal STV which is active when being at the high level;

except the shift register unit at the first stage, the input terminal of the shift register unit at each stage is connected to the carry signal output terminal of the shift register unit at a previous stage; each of the shift register units has two output terminals: the carry signal output terminal CA(n) connected to the input terminal IN of the shift register unit at a next stage, and a driving signal output terminal OUT(n) connected to the row scan line Gn of the Active Matrix, wherein n is an integer and is less than or equal to N;

the clock control signals of shift register units at two adjacent stages have opposite phases, for example, if the first clock input terminal of the shift register unit at the first stage is connected to the first clock signal CLK1 and the second clock signal input terminal of the shift register unit at the first stage is connected to the second clock signal CLK2, then the first clock signal input terminal of the shift register unit at the second stage adjacent to the first stage is connected to the second clock signal CLK2 and the second clock signal input terminal of the shift register unit at the second stage is connected to the first clock signal CLK1.

Figure 21:
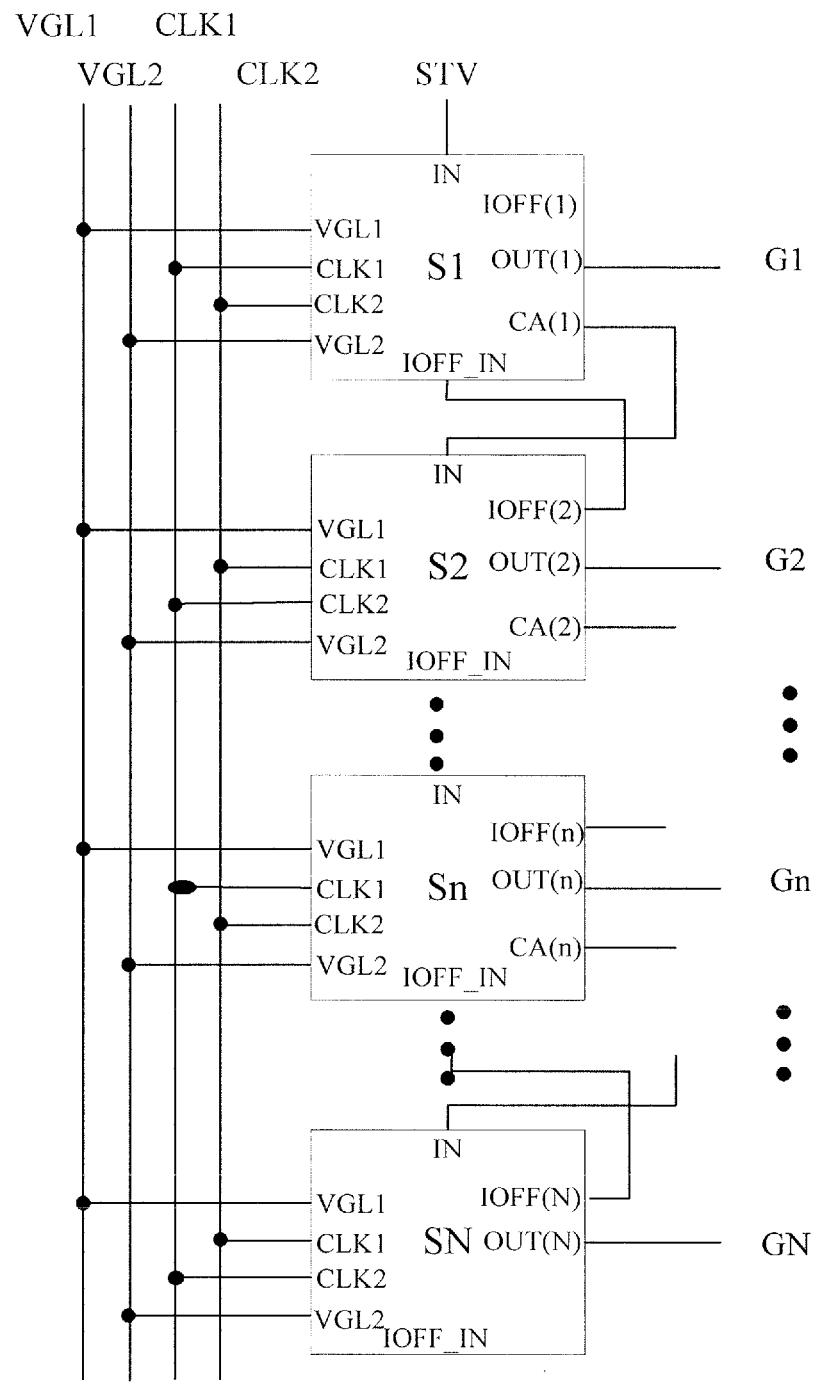
FIG. 21 is a circuit diagram of a shift register according to a second embodiment of the present disclosure.

As shown in FIG. 21, a shift register according to a second embodiment of the present disclosure is based on the shift register according to the first embodiment of the present disclosure, and the shift register according to the second embodiment of the present disclosure includes the shift register unit according to the seventh, eighth, ninth or tenth embodiment of the present disclosure.

The difference between the shift register according to the second embodiment of the present disclosure and the shift register according to the first embodiment of the present disclosure lies in that: except the shift register unit at a last stage, the cutting-off control signal input terminal of the shift register unit at each stage is connected to the cutting-off control signal output terminal of the shift register unit at a next stage.

In the present disclosure, there is further provided a display apparatus including the above-described shift registers, the display apparatus may include liquid crystal display apparatuses, for example liquid crystal panel, liquid crystal television, mobile phone, liquid crystal display. Besides the liquid crystal display apparatus, the display apparatus may further include Organic Light-Emitting Display or other kinds of display apparatus, for example, electric reader, etc. The shift register can function as the scanning circuit or gate driving circuit of the display apparatus, so as to provide the function of progressive scanning and transfer the scanning signal to the display area.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register unit, including:
    an input terminal;
    a first output control module having a control signal output terminal connected to a pulling-up node, for pulling up a driving signal in an evaluating phase;
    a second output control module having a control signal output terminal connected to a pulling-down node, for pulling down the driving signal in a resetting phase;
    wherein the first output control module is further connected to the input terminal;
    wherein the shift register unit further includes:
        a carry signal output terminal;
        a driving signal output terminal;
        a staged output module connected to the pulling-up node, the pulling-down node, the carry signal output terminal and the driving signal output terminal, respectively, configured to a carry signal and a driving signal in stages so that the driving signal maintains a high level in the evaluating phase and a low level in the resetting phase; and
        a pulling-up node level maintaining module configured, in the evaluating phase, maintaining the level at the pulling-up node at a high level via the first output control module so that the driving signal maintains a high level;
    wherein the first output control module comprises a feedback signal receiving terminal; and
    wherein the pulling-up node level maintaining module comprises:

a first feedback control TFT having a gate connected to the carry signal output terminal, a source connected to the feedback signal receiving terminal, and a drain connected to a first node.

2. The shift register unit according to claim 1, wherein the staged output module comprises a carry signal output unit and a driving signal output unit;
  the carry signal output unit is configured to make the carry signal output terminal output the first low level under the control of the first output control module in a pre-charging phase and the resetting phase, and to make the carry signal output terminal output a high level under the control of the second output control module in the evaluating phase; and
  the driving signal output unit is configured to make the driving signal output terminal output a high level under the control of the second output control module in the evaluating phase, and to make the driving signal output terminal output the second low level under the control of the first output control module in the resetting phase.

3. The shift register unit according to claim 2, wherein
  the carry signal output unit includes a first carry signal output Thin Film Transistor TFT and a second carry signal output TFT;
  the first carry signal output TFT has a gate connected to the control signal output terminal of the first output control module, a source connected to the carry signal output terminal, and a drain connected to a first clock signal input terminal; and
  the second carry signal output TFT has a gate connected to the control signal output terminal of the second output control module, a source connected to the first low level output terminal, and a drain connected to the carry signal output terminal.

4. The shift register unit according to claim 3, wherein
  the driving signal output unit includes a first driving TFT, a second driving TFT and a bootstrap capacitor;
  the first driving TFT has a gate connected to the control signal output terminal of the first output control module, a source connected to the driving signal output terminal, and a drain connected to a first clock signal input terminal;
  the second driving TFT has a gate connected to the control signal output terminal of the second output control module, a source connected to the second low level output terminal, and a drain connected to the driving signal output terminal; and
  the bootstrap capacitor is connected in parallel between the gate and the source of the first driving TFT.

5. The shift register unit according to claim 4, wherein the first carry signal output TFT, the second carry signal output TFT, the first driving TFT and the second driving TFT are depletion type TFTs.

6. The shift register unit according to claim 5, wherein
  a threshold voltage of the first carry signal output TFT, a threshold voltage of the second carry signal output TFT, a threshold voltage of the first driving TFT and a threshold voltage of the second driving TFT are a same depletion threshold voltage;
  the first low level is lower than the second low level, and the absolute value of difference between the first low level and the second low level is larger than the absolute value of the depletion threshold voltage.

7. The shift register unit according to claim 3, wherein the first output control module includes a first TFT, a second TFT, a third TFT and a fourth TFT, wherein a gate of the first TFT is connected to a second clock signal input terminal, a drain of the first TFT is connected to the input terminal, and a source of the first TFT is connected to a drain of the second TFT;
  a gate of the second TFT is connected to the second clock signal input terminal, and a source of the second TFT is connected to a drain of the third TFT;
  a gate of the third TFT is connected to the pulling-down node and a source of the third TFT is connected to a drain of the fourth TFT;
  a gate of the fourth TFT is connected to the pulling-down node, and a source of the fourth TFT is connected to the first low level output terminal;
  wherein the source of the first TFT is further connected to the pulling-up node level maintaining module;
  the source of the third TFT is further connected to the source of the first TFT; and
  the source of the second TFT is connected to the control signal output terminal of the first output control module.

8. The shift register unit according to claim 3, wherein the second output control module includes a first output control TFT, a second output control TFT, and a third output control TFT, wherein
  a gate of the first output control TFT is connected to the gate of the first carry signal output TFT, a source of the first output control TFT is connected to a drain of the second output control TFT, and a drain of the first output control TFT is connected to the gate of the second carry signal output TFT;
  a gate of the second output control TFT is connected to the gate of the first carry signal output TFT, and a source of the second output control TFT is connected to the first low level output terminal; and
  a gate and a drain of the third output control TFT are connected to a high level output terminal, and a source of the third output control TFT is connected to the gate of the second carry signal output TFT.

9. The shift register unit according to claim 3,
  wherein the first feedback control TFT is a depletion type TFT;
  a threshold voltage of the first feedback control TFT is the depletion threshold voltage; and
  the first low level is lower than the second low level, and the absolute value of difference between the first low level and the second low level is larger than the depletion threshold voltage.

10. The shift register unit according to claim 9, further including a cutting-off control signal input terminal and a cutting-off control signal output terminal;
  the pulling-up node level maintaining module further includes a second feedback control TFT;
  a gate of the second feedback control TFT is connected to the carry signal output terminal, a source of the second feedback control TFT is connected to the first node, and a drain of the second feedback control TFT is connected to the cutting-off control signal output terminal; and
  the second output control module is connected to the cutting-off control signal input terminal.

11. The shift register unit according to claim 10, wherein the staged output module further includes a staged output unit connected between the carry signal output unit and the driving signal output unit.

12. The shift register unit according to claim 11, wherein the staged output unit includes a first staged output TFT and a second staged output TFT;
  a gate of the first staged output TFT is connected to the gate of the first carry signal output TFT, a drain of the first staged output TFT is connected to the first clock signal input terminal, and a source of the first staged output TFT is connected to the first node; and a gate of the second staged output TFT is connected to the gate of the second carry signal output TFT, a source of the second staged output TFT is connected to the second low level output terminal, and a drain of the second staged output TFT is connected to the source of the first staged output TFT.

13. The shift register unit according to claim 9, wherein the first node is connected to the driving signal output terminal.

14. A driving method, applied to the shift register unit according to claim 1, including: the driving method includes:

in a phase wherein the input terminal inputs a high level, the first clock signal is at the low level, the first output control module controls to pre-charge the bootstrap capacitor, so as to control the carry signal output terminal and the driving signal output terminal to output the first low level; the second output control module controls the output terminal thereof to output the first low level;

in a next half clock cycle, the first clock signal becomes a high level, the first output control module controls the carry signal output terminal and the driving signal output terminal to output a high level; and in a third half clock cycle, the first clock signal becomes a low level, the first output control module and the second output control module control the carry signal output terminal to output the first low level and control the driving signal output terminal to output the second low level.

15. A shift register, including a plurality of the shift register units according to claim 1 arranged at a plurality of stages; wherein except the shift register unit at a first stage, the input terminal of the shift register unit at each stage is connected to the carry signal output terminal of the shift register unit at a previous stage.

* * * * *